(12) United States Patent
Lowrey

(10) Patent No.: US 7,763,879 B2
(45) Date of Patent: Jul. 27, 2010

(54) THREE-DIMENSIONAL PHASE-CHANGE MEMORY ARRAY

(75) Inventor: Tyler Lowrey, West Augusta, VA (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 12/152,557

(22) Filed: May 15, 2008

(65) Prior Publication Data

US 2008/0210926 A1 Sep. 4, 2008

Related U.S. Application Data

(62) Division of application No. 11/522,584, filed on Sep. 18, 2006, now Pat. No. 7,391,045.

(51) Int. Cl.
*H01L 29/06* (2006.01)

(52) U.S. Cl. ............................ 257/5; 257/209; 257/530; 257/E27.026

(58) Field of Classification Search ................. 257/3–5, 257/209, 528–530, 544, E27.026, E45.002
See application file for complete search history.

(56) References Cited

U.S. PATENT DOCUMENTS

| | | | |
|---|---|---|---|
| 6,420,215 B1 * | 7/2002 | Knall et al. | 438/131 |
| 6,525,953 B1 * | 2/2003 | Johnson | 365/63 |
| 7,259,038 B2 * | 8/2007 | Scheuerlein | 438/95 |
| 2004/0252544 A1 * | 12/2004 | Lowrey et al. | 365/148 |

* cited by examiner

*Primary Examiner*—Tuan N. Quach
(74) *Attorney, Agent, or Firm*—Kevin L. Bray

(57) ABSTRACT

A three-dimensional phase-change memory array. In one embodiment of the invention, the memory array includes a first plurality of diodes, a second plurality of diodes disposed above the first plurality of diodes, a first plurality phase-change memory elements disposed above the first and second plurality of diodes and a second plurality of memory elements disposed above the first plurality of memory elements.

15 Claims, 24 Drawing Sheets

XC-XC

XD-XD

THREE-DIMENSIONAL PHASE-CHANGE MEMORY ARRAY

RELATED APPLICATION INFORMATION

This application is a divisional of U.S. patent application Ser. No. 11/522,584, entitled "Three-Dimensional Phase-Change Memory" and filed on Sep. 18, 2006, now U.S. Pat. No. 7,391,045, the disclosure of which is incorporated by reference in its entirety herein.

FIELD OF THE INVENTION

The present invention is related to electrically operated phase-change memory. In particular, the present invention relates to a three-dimensional memory array comprising electrically operated phase-change memory.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit or programmed to a low resistance state to store a logic ZERO data bit.

One type of material that can be used as the memory material for programmable resistance elements is phase-change material. Phase-change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The phase-change materials may be programmed between different detectable states of local order across the entire spectrum between completely amorphous and completely crystalline states. That is, the programming of such materials is not required to take place between completely amorphous and completely crystalline states but rather the material can be programmed in incremental steps reflecting (1) changes of local order, or (2) changes in volume of two or more materials having different local order so as to provide a "gray scale" represented by a multiplicity of conditions of local order spanning the spectrum between the completely amorphous and the completely crystalline states. For example, phase-change materials may be programmed between 3 or more resistive states to store more than 1 bit of information in one memory cell. For example, phase-change materials may be programmed between four resistance states to store 2 bits of information in a memory cell.

A volume of phase-change material may be programmed between a more ordered, low resistance state and a less ordered, high resistance state. A volume of phase-change is capable of being transformed from a high resistance state to a low resistance state in response to the input of a single pulse of energy referred to as a "set pulse". The set pulse is sufficient to transform a volume of memory material from the high resistance state to the low resistance state. It is believed that application of a set pulse to a volume of memory material changes the local order of at least a portion of the volume of memory material. Specifically, it is believed that the set pulse is sufficient to change at least a portion of a volume of memory material from a less-ordered amorphous state to a more-ordered crystalline state.

A volume of memory material is also capable of being transformed from the low resistance state to the high resistance state in response to the input of a single pulse of energy which is referred to as a "reset pulse". The reset pulse is sufficient to transform a volume of memory material from the low resistance state to the high resistance state. While not wishing to be bound by theory, it is believed that application of a reset pulse to a volume of memory material changes the local order of at least a portion of the volume of memory material. Specifically, it is believed that the reset pulse is sufficient to change at least a portion of the volume of memory material from a more-ordered crystalline state to a less-ordered amorphous state.

The use of phase-change materials for electronic memory applications is known in the art. Phase-change materials and electrically programmable memory elements formed from such materials are disclosed, for example, in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in U.S. patent application Ser. No. 09/276,273, the disclosure of which is also incorporated herein by reference.

It is important to be able to accurately read the resistance states of programmable resistance elements which are arranged in a memory array. The present invention describes an apparatus and method for accurately determining the resistance states of programmable resistance elements arranged as memory cells in a memory array. Background art circuitry is provided in U.S. Pat. No. 4,272,833 which describes a reading apparatus based upon the variation in the threshold levels of memory elements, and U.S. Pat. No. 5,883,827 which describes an apparatus using a fixed resistance element to generate reference signals. Both U.S. Pat. No. 4,272,833 and U.S. Pat. No. 5,883,827 are incorporated by reference herein.

SUMMARY OF THE INVENTION

An aspect of the present invention is a memory array, comprising: a plurality of first isolation elements; a plurality of second isolation elements disposed above the first isolation elements; a plurality of first phase-change memory elements disposed above the second isolation elements, each of the first memory elements electrically coupled to a corresponding one of the first isolation elements; and a plurality of second phase-change memory elements disposed above the first memory elements, each of the second memory elements electrically coupled to a corresponding one of the plurality of second isolation elements.

Another aspect of the present invention is a memory array, comprising: a plurality of lower first conductive lines; a plurality of upper first conductive lines disposed above the lower first conductive lines; a plurality of lower second conductive lines disposed above the upper first conductive lines, the lower second conductive lines crossing the lower and upper first conductive lines; a plurality of upper second conductive lines disposed above the lower second conductive lines, the upper second conductive lines crossing the lower and upper first conductive lines; a plurality of first phase-change memory cells, each of the first phase-change memory cells coupled between a corresponding lower first conductive line and a lower second conductive line; and a plurality of second phase-change memory cells, each of the second phase-change memory cells coupled between a corresponding upper first conductive line and a corresponding upper second conductive line.

Another aspect of the present invention is an integrated circuit, comprising: a memory array, comprising: a plurality of first address lines, each of the first address lines having a width $W_1$; a plurality of second address lines crossing the first address lines, each of the second address lines having a width $W_2$; and a plurality of phase-change memory cells, each of the memory cells electrically coupled between a corresponding one of the first address lines and a corresponding one of the second address lines, wherein the cell size of the memory array is less than $4(W_1)(W_2)$. It is, of course, noted that the notation $4(W_1)(W_2)$ means: 4 times $W_1$ times $W_2$.

BRIEF DESCRIPTION OF THE DRAWINGS

FIG. 19A' is cross-sectional view through XA-XA with overlap of the upper and lower diode strips and overlap of the corresponding upper and lower row lines;

FIG. 19B' is a cross-sectional view through XB-XB with overlap of the upper and lower diode strips and overlap of the corresponding upper and lower row lines;

FIG. 19C' is a cross-sectional view through YA-YA with overlap of the upper and lower memory strips and overlap of the corresponding upper and lower column lines;

FIG. 19D' is a cross-sectional view through YB-YB with overlap of the upper and lower memory strips and overlap of the corresponding upper and lower column lines;

DETAILED DESCRIPTION OF THE INVENTION

Figure 17:
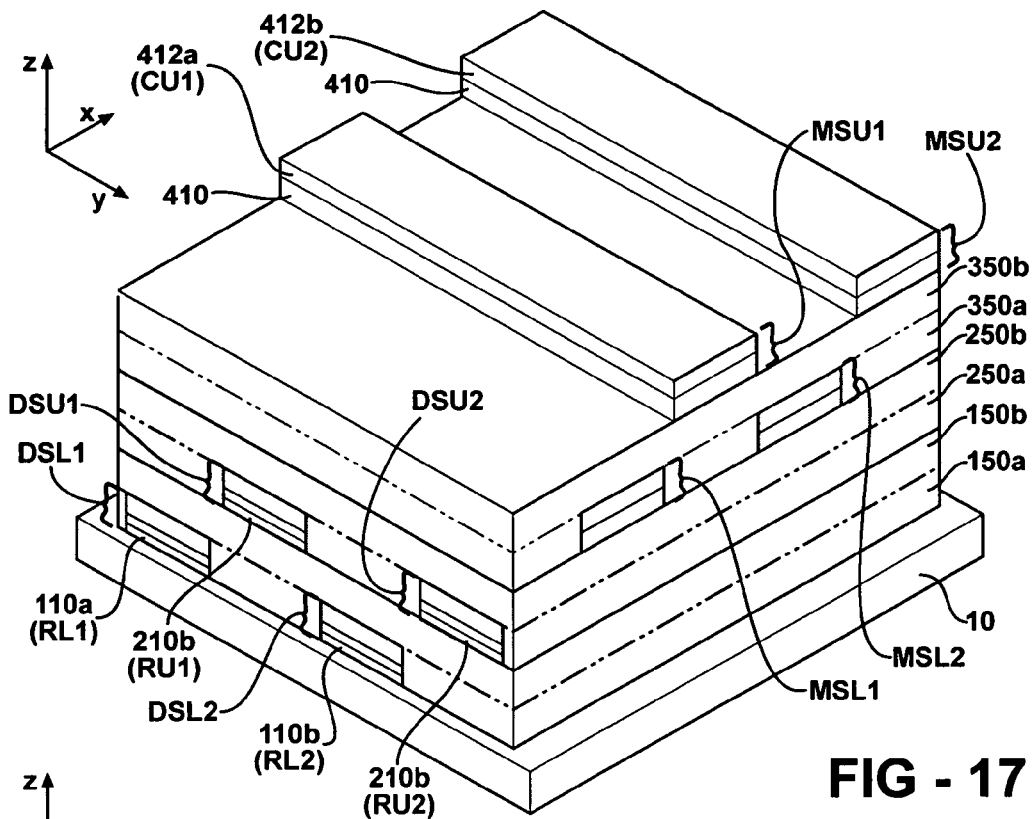
Figure 18:
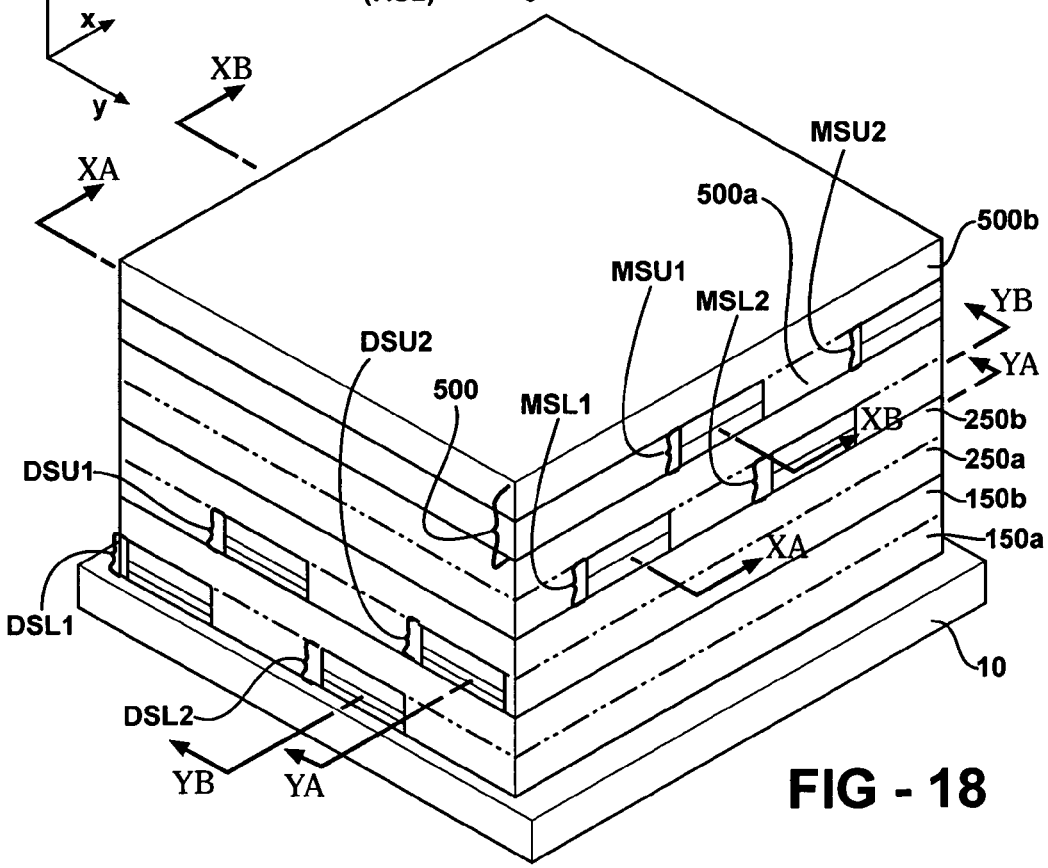

FIG. 18 shows an isometric view of an embodiment of a three-dimensional memory array of the present invention. FIGS. 1 through 18 are three-dimensional isometric views illustrating the step-by-step fabrication of the three-dimensional memory array shown in FIG. 18. FIGS. 19A, 19B, 19C and 19D show cross-sectional views of the memory array shown in FIG. 18 through the cross-sections XA-XA, XB-XB, YA-YA and YB-YB, respectively. The cross-section through diode strip DSU1 is the same as the cross-section YA-YA and the cross-section through diode strip DSL1 is the same as the cross-section YB-YB. Likewise, the cross-section through lower memory strip MSL2 is the same as the cross-section XA-XA and the cross-section through upper memory strip MSU2 is the same as the cross-section XB-XB.

Figure 20:
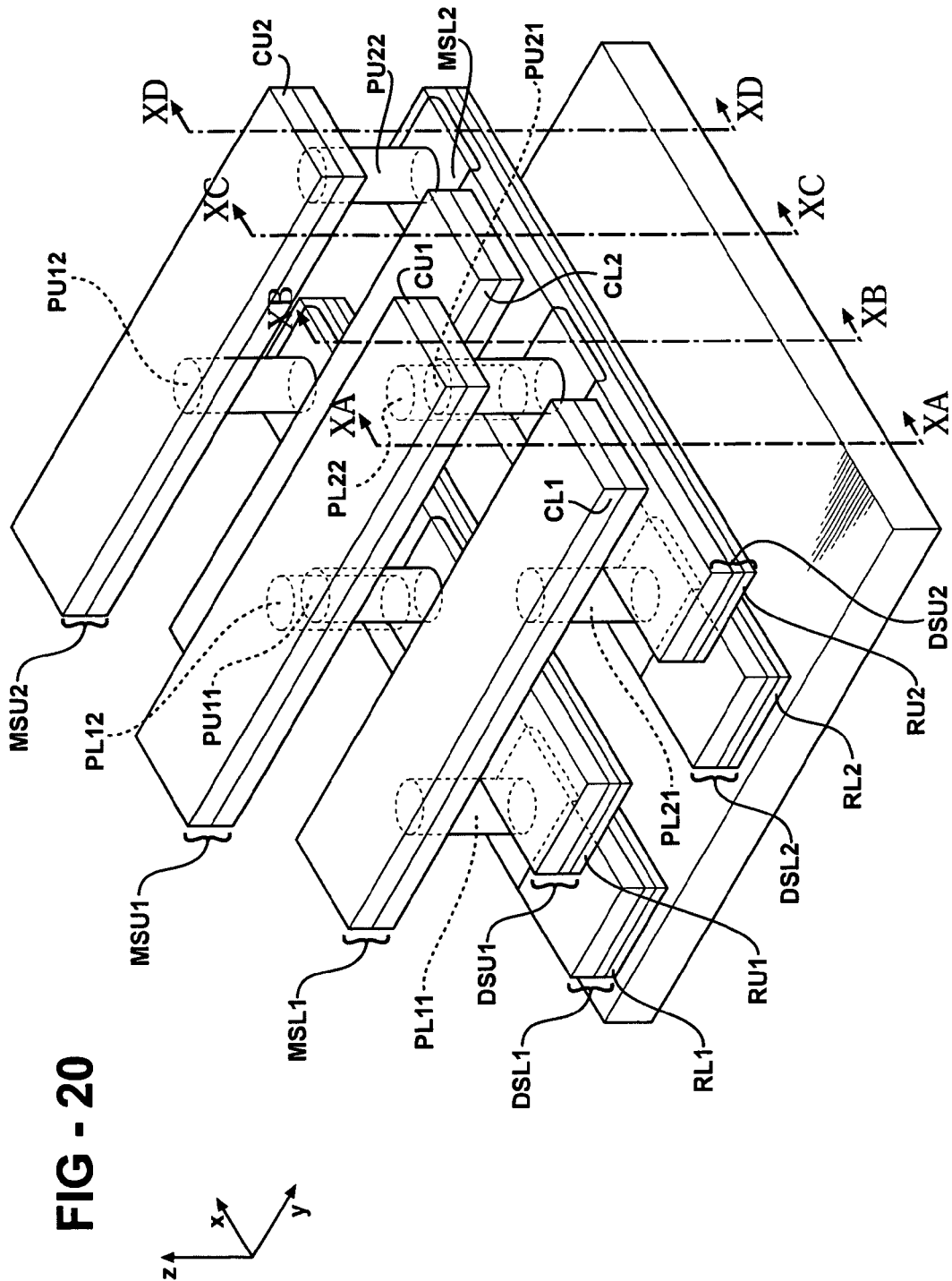
FIG. 20 is an isometric view of the three-dimensional memory array shown in FIG. 18 with the dielectric layers removed.
Figure 23A:
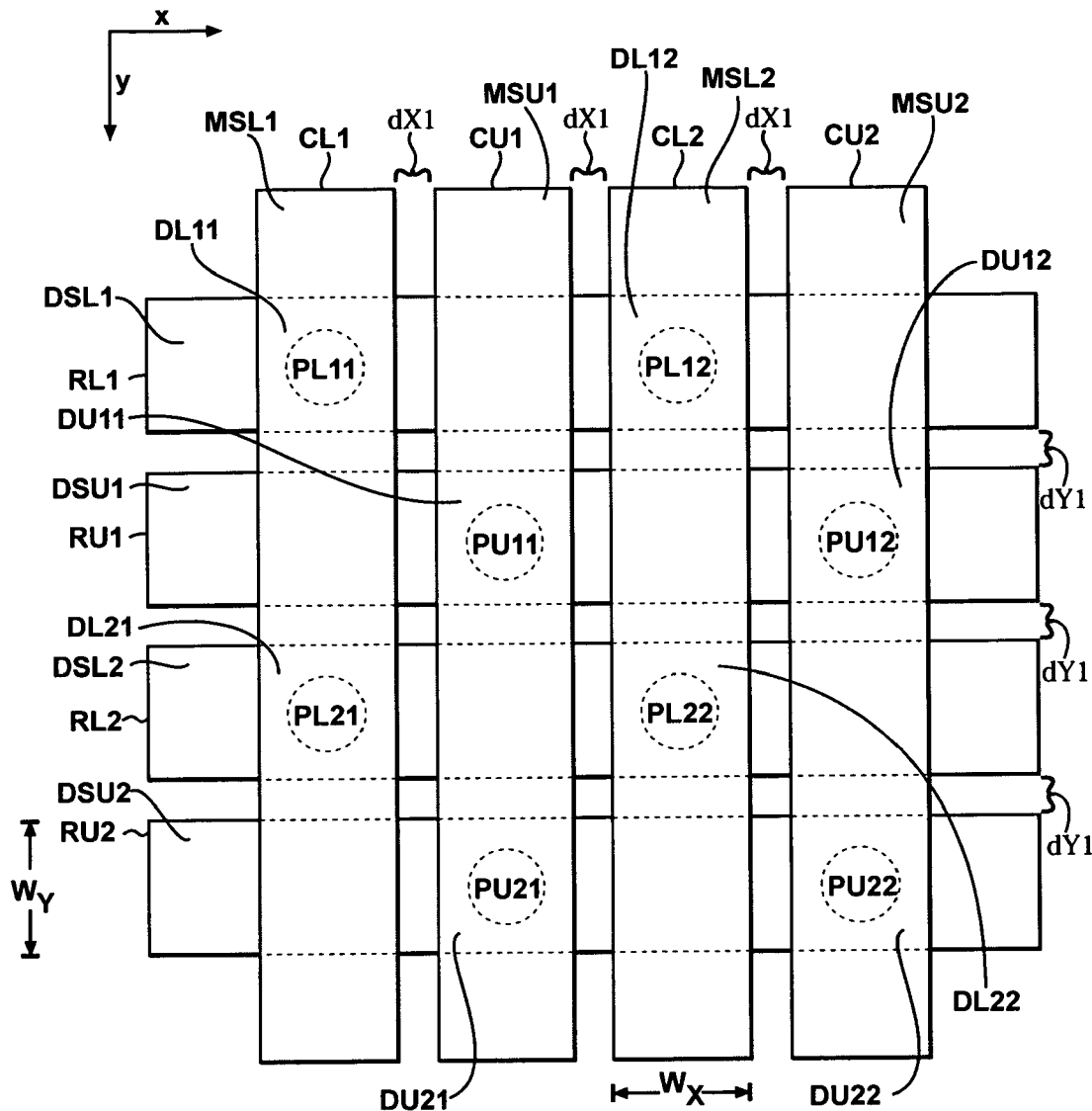
FIG. 23A is a top view of an embodiment of a three-dimensional memory array of the present invention where there is no overlap between the row lines and no overlap between the column lines.

FIG. 20 shows that same three-dimensional memory array from FIG. 18 except that the dielectric layers have been removed so that the components of the memory array can more clearly be seen. FIGS. 21A, 21B, 21C and 21D show cross-sectional views of the memory array shown in FIG. 20 through the cross-sections XA-XA, XB-XB, XC-XC and XD-XD, respectively. FIG. 23A shows a top view of the three-dimensional memory array shown in FIG. 20.

Figure 1:
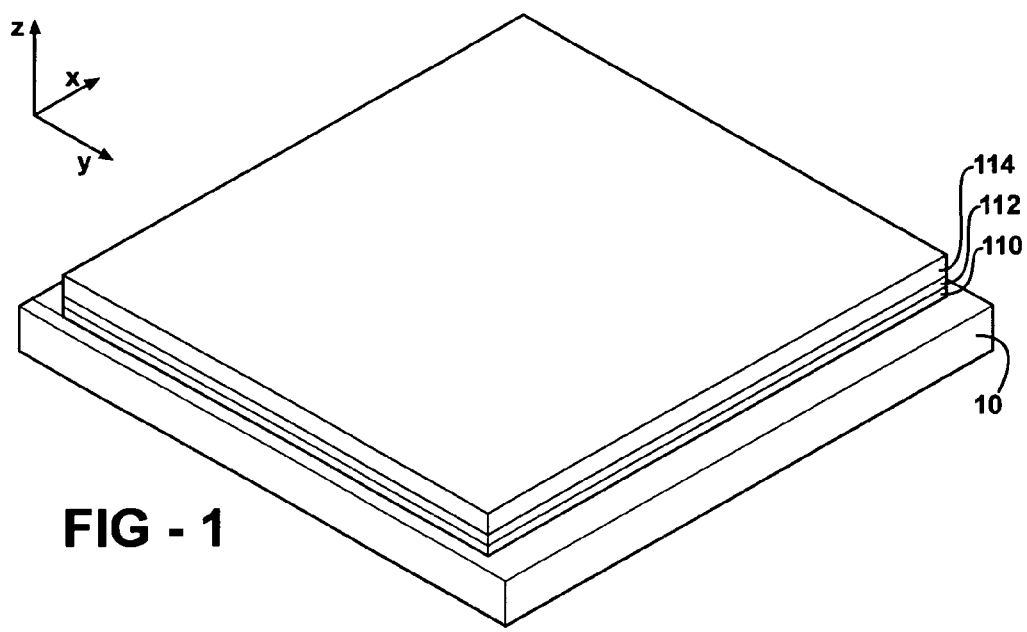
FIGS. 1 through 18 are isometric views illustrating the fabrication of an embodiment of a three-dimensional memory array of the present invention.

The step-by-step fabrication of the memory array shown in FIG. 18 and FIG. 20 will now be discussed. At each step of the process, the reader is also referred to the cross-sectional views XA-XA, XB-XB, YA-YA, YB-YB, shown in FIGS. 19A through 19D, respectively. Referring to FIG. 1, a conductive layer 110 is formed on a semiconductor substrate 10. The substrate 10 may be a conventional silicon monocrystalline substrate with a dielectric layer, such as silicon dioxide, deposited thereon. Alternately, the substrate 10 may be a silicon-on-sapphire substrate, a dielectrically isolated substrate or a silicon-on-insulator substrate, each with a dielectric layer, such as silicon dioxide deposited thereon. The substrate 10 may include peripheral circuitry such as driver circuitry and/or address circuitry.

Figure 2:
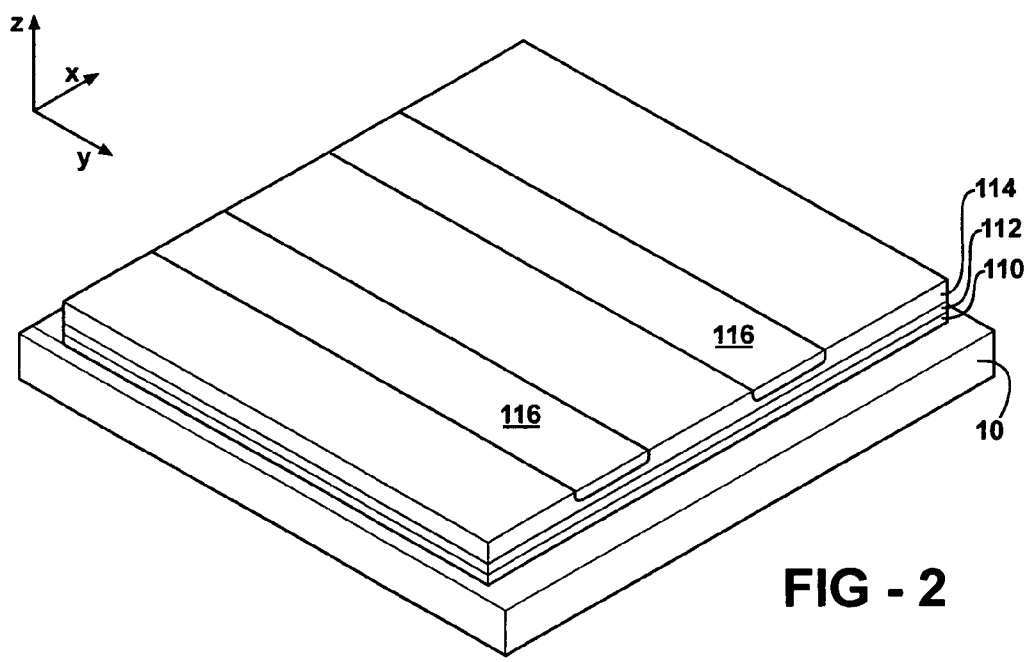

An n+ type silicon layer 112 is then deposited on the conductive layer 110 and an n type silicon layer 114 is deposited on the n+ type layer 112. The layer 112 and the layer 114 are preferably deposited either as amorphous silicon or as polysilicon. Referring to FIG. 2, the n type layer 114 may then be appropriately masked and portions of the n type layer 114 may then be doped (using, for example, ion implantation or diffusion techniques) to form p+ type strips 116 in the n type layer 114. The p+ type strips 116 may have a width in the X-direction of about (5/3)F. "F" is the minimum photolithographic feature size. The minimum feature size may be the limit achievable by lithographic techniques. In one embodiment, the feature size F may be about 1000 Angstroms or less.

After the structure shown in FIG. 2 is completed so that the p+ strips 116 are formed, the structure is subjected to a recrystallization process. This process converts the amorphous silicon material or polysilicon material of the n+ type layers 112, the n type layers 114 and the p+ type layers 116 to a substantially monocrystalline material.

Figure 3:
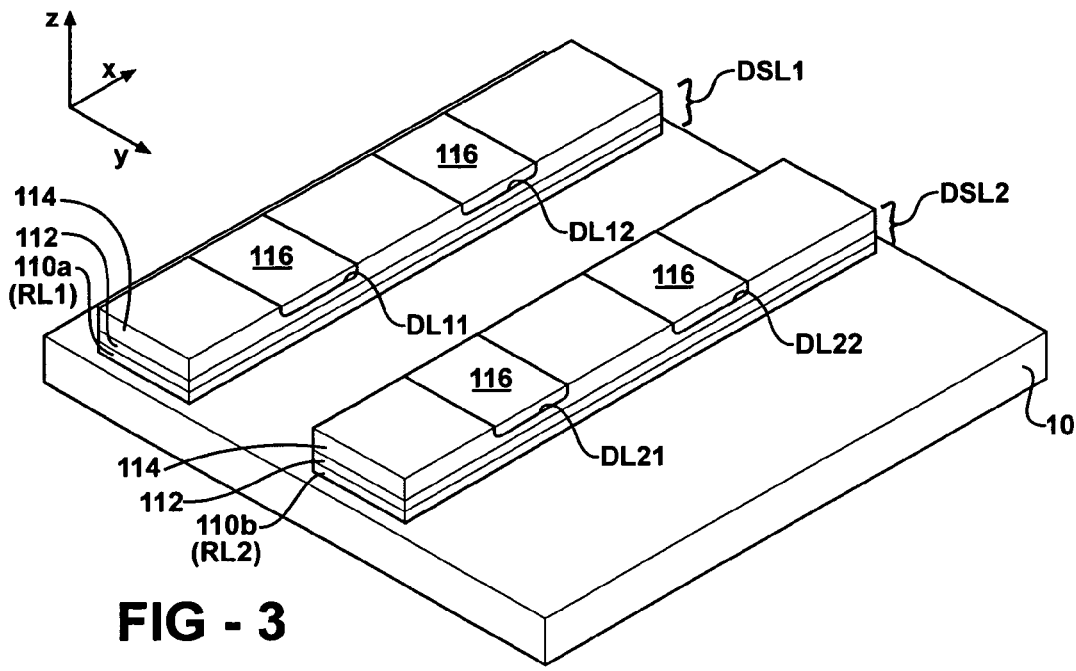

Referring to FIG. 3, the layers 110, 112, 114 and 116 are masked and etched to form lower diode strips DSL1 and DSL2. The diode strip DSL1 includes a lower conductive line 110a. The diode strip DSL1 also includes a lower diode DL11 and a lower diode DL12 defined by the semiconductor junctions between the n type layer 114 and the p+ type regions 116. Diodes DL11 and DL12 are electrically coupled to the conductive line 110a.

Likewise, diode strip DSL2 includes a lower conductive line 110b. The diode strip DSL2 also includes a lower diode DL21 and a lower diode DL22 defined by the semiconductor junctions between the n type layer 114 and the p+ type regions 116 of diode strip DSL2. Diodes DL21 and DL22 are electrically coupled to the conductive line 110b.

The conductive lines 110a and 110b may serve as address lines for the memory array. In the embodiment shown, the conductive line 110a is designated as a first lower row line RL1 for the memory array while the conductive line 110b is designated as a second lower row line RL2 for the memory array. The lower row lines may also be referred to as lower word lines. The lower row lines RL1 and RL2 are laterally spaced apart in the Y-direction. The space between the lines may be equal to the width of the row lines.

In an embodiment of the invention, the lower diodes strips DSL1 and DSL2 may each be formed so as to have a width in the Y-direction of about (5/3)F. Hence, the corresponding lower row lines RL1, RL2 may have the same width in the Y-direction of about (5/3F). The lower diodes DL11, DL12, DL21, DL22 may thus have a lateral dimension in the X-direction and a lateral dimension in the Y-direction of about (5/3)F.

Figure 4:
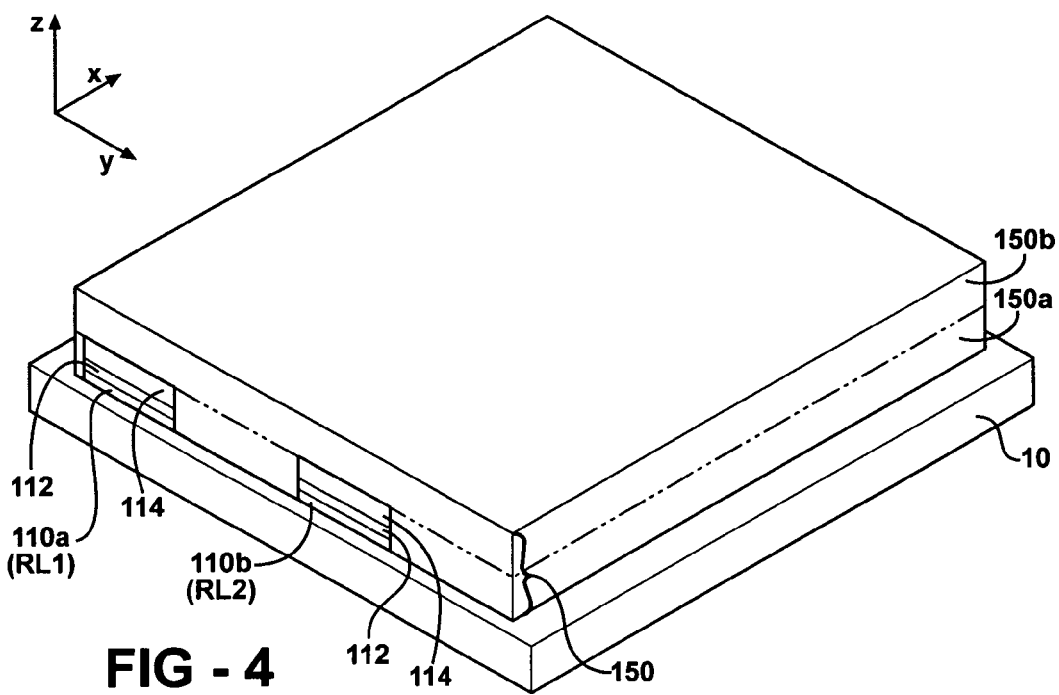

As shown in FIG. 4, a dielectric material 150 is disposed between as well as over the lower diode strips and planarized using chemically mechanically polished (CMP) to form the structure shown in FIG. 4. As shown in FIG. 4, the dielectric layer 150 includes a first portion 150a which fills the gaps between the diode strips DSL1 and DSL2 as well as a second portion 150b which is disposed above the diode strips. As shown in FIGS. 19A-D, the height of the second portion 150b is represented as dZ1. The distance dZ1 represents the thickness of the second portion 150b. In another embodiment, a spin-on-glass (SOG) may be used to fill the voids between the adjacent diode strips. In this case, alternative planarization approaches can be used, such as plasma etching, for example. Other fill and planarization methods may be used.

Figure 5:
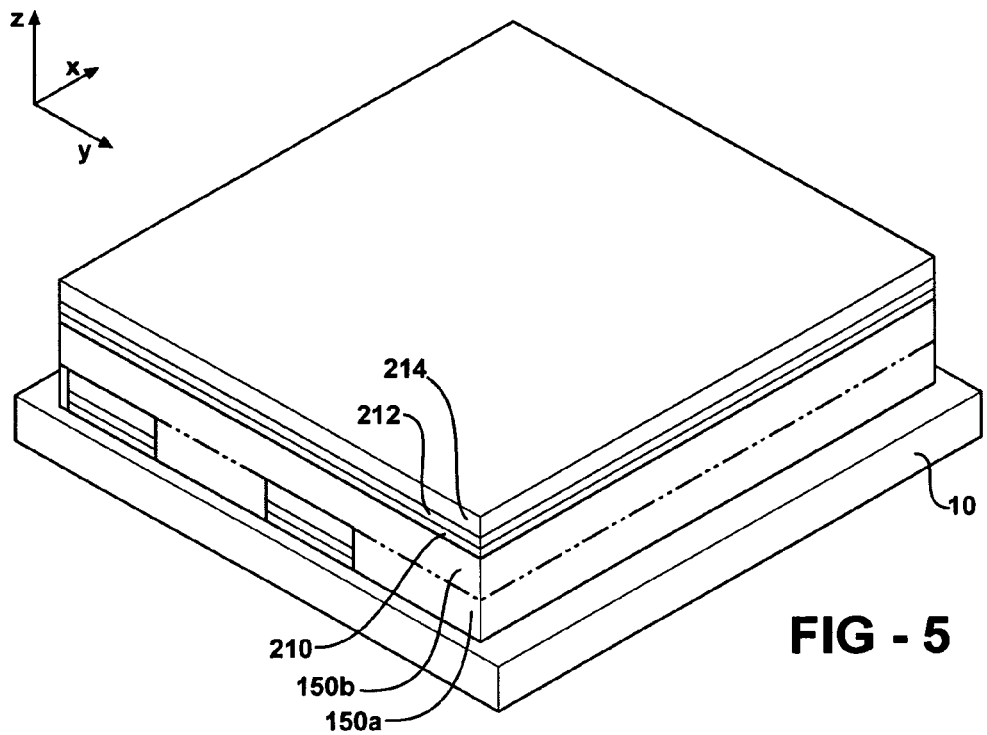
Figure 6:
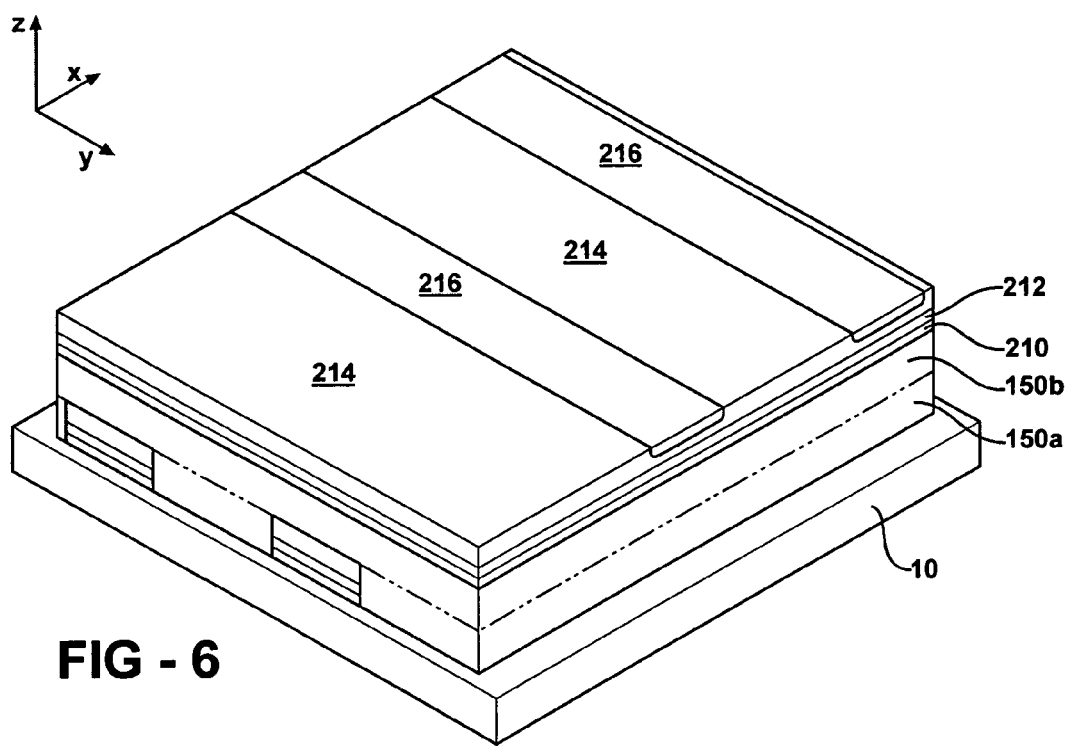

Referring to FIG. 5, a conductive layer 210 is formed over the dielectric layer 150, an n+ type silicon layer 212 is formed over the conductive layer 210, and an n type silicon layer 214 is formed over the n+ type layer 212. The n+ type layer as well as the n type layer may be deposited as amorphous silicon or as polysilicon. The n type layer 214 is then appropriately masked and doped to form p+ strips 216 as shown in FIG. 6 using patterning and dopant introduction techniques well known in the art (where dopant introduction techniques include, for example, ion implantation or diffusion techniques). The p+ strips 216 may have a width in the X-dimension of about (5/3)F.

After the structure shown in FIG. 6 is completed so that the p+ strips 216 are formed, the structure is subjected to a recrystallization process. This process converts the amorphous silicon material or polysilicon material of the n+ type layers 212, the n type layers 214 and the p+ type layers 216 to a substantially monocrystalline material.

Figure 7:
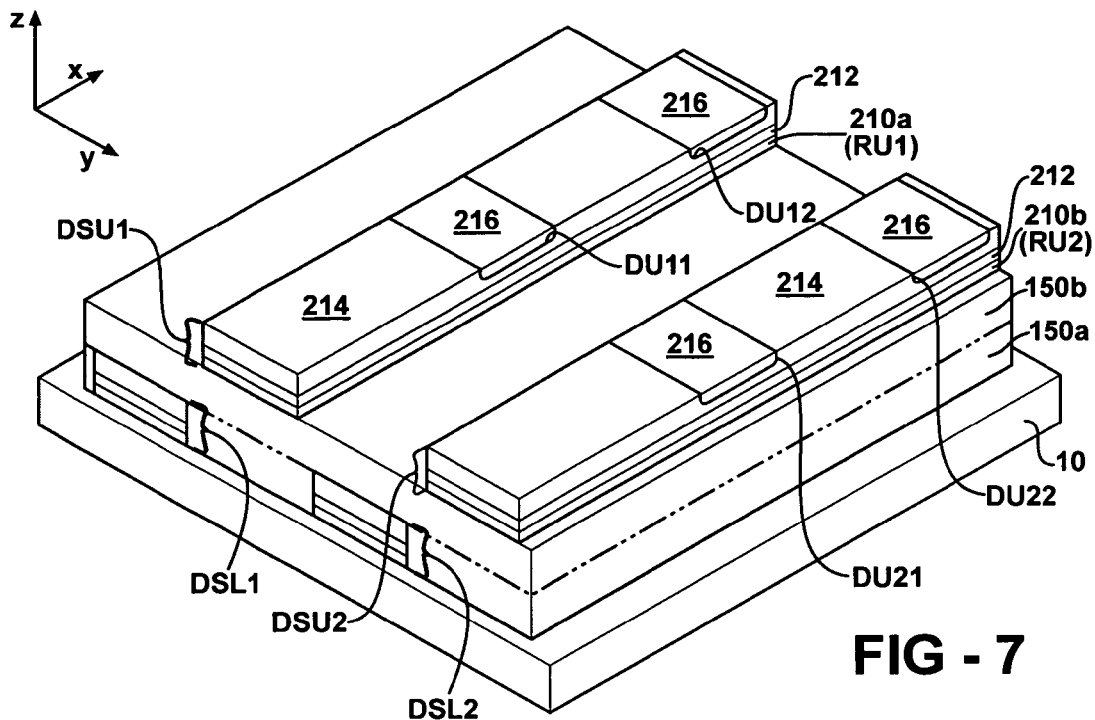

The conductive layer 210, n+ type layer 212, n type layer 214 and the p+ type layers 216 are then masked and etched to form the upper diode strips DSU1 and DSU2 as shown in FIG. 7. The upper diode strip DSU1 includes a conductive line 210a. The diode strip DSU1 also includes a first upper diode DU11 and a second upper diode DU12 defined by the semiconductor junctions between the n type layer 214 and the p+ type regions 216 of upper diode strip DSU1. Diodes DU11 and DU12 are electrically coupled to the conductive line 210a.

Likewise, upper diode strip DSU2 includes a conductive line 210b. The diode strip DSU2 also includes a first upper diode DU21 and a second upper diode DU22 defined by the semiconductor junctions between the n type layer 214 and the p+ type regions 216 of diode strip DSU2. Diodes DU21 and DU22 are electrically coupled to the conductive line 210b. The conductive lines 210a and 210b may also serve as address lines for the memory array. In the embodiment shown, the conductive line 210a is designated as a first upper row line RU1 for the memory array. Likewise, the conductive line 210b is designated as a second upper row line RU2 for the memory array. The upper and lower row lines RU1, RU2, RL1 and RL2 are laterally spaced apart in the Y-direction. The space between the lines may be equal to the width of the row lines. Hence, the space between the lines may have a lateral distance in the Y direction which may be (5/3)F.

It is noted that the upper row lines RU1, RU2 are disposed above the lower row lines. In addition, the upper row lines RU1, RU2 are staggered with respect to the lower row lines RL1, RL2. The placement of the lower and upper row lines alternate in the Y-direction so that a lower row line is following by an upper row line and an upper row line is followed by a lower row line. In one embodiment, the upper and lower row lines may not overlap at all. In another embodiment, there may be some overlap between the upper and lower row lines.

In an embodiment of the invention, the upper diode strips DSU1 and DSU2 may be formed so as to have a width in the Y-direction of about (5/3)F. Hence, the corresponding row lines RU1, RU2 may also have a width in the Y-direction of about (5/3)F. The diodes DU11, DU12, DU21, DU22 may thus have a lateral dimension in the Y-dimension equal to about (5/3)F as well as a lateral dimension in the X-dimension of about (5/3)F.

It is noted that the upper diode strips DSU1, DSU2 are formed above the lower diode strips DSL1, DSL2. The upper and lower strips are separated vertically by a distance dZ1 which is the thickness of the dielectric layer portion 150b. The upper diode strips DSU1, DSU2 are disposed above the lower diode strips even through they do not overlap the lower diode strips in the embodiment shown in FIG. 7. In another embodiment of the invention, it is possible that the upper diode strips may overlap the lower diode strips.

Figure 8:
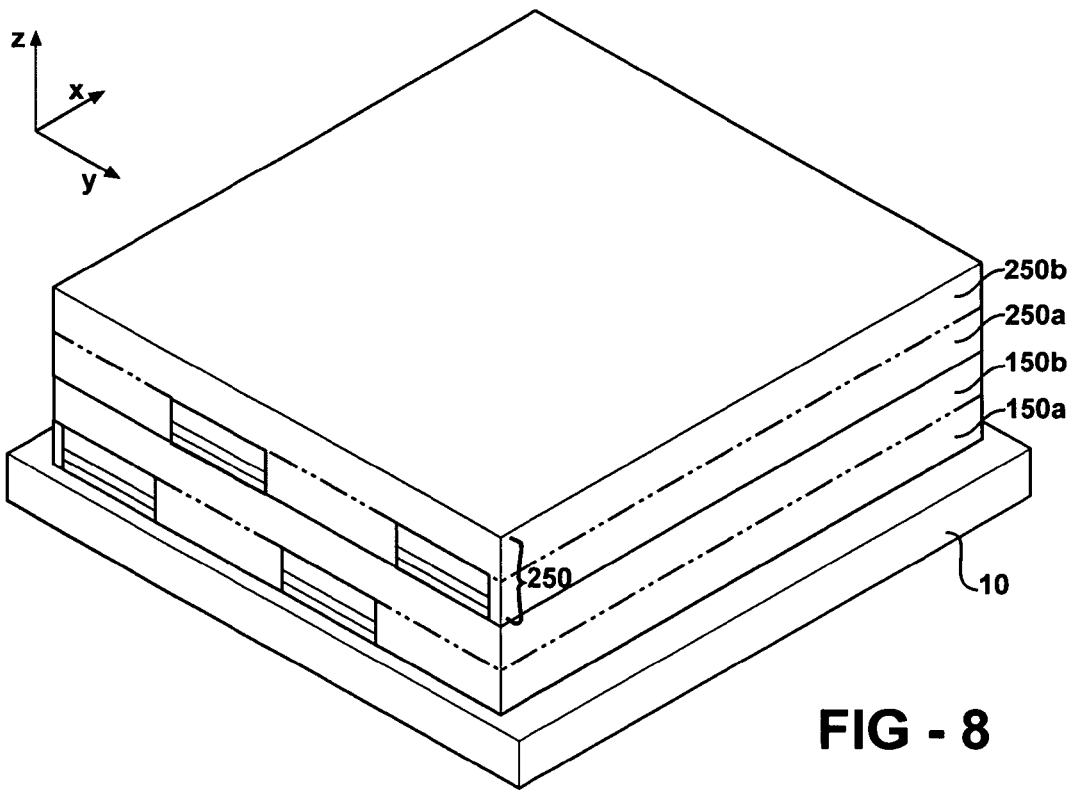

A dielectric material 250 is disposed between the upper diode strips DSU1 and DSU2 as well as over the diode strips DSU1 and DSU2 and then chemically mechanically polished (CMP) to form the planarized structure shown in FIG. 8. As shown, the dielectric layer 250 includes a first portion 250a disposed between the upper diode strips DSU1 and DSU2 as well as a second portion 250b disposed above the upper diode strips DSU1 and DSU2. The height of the second dielectric portion 250b is designated as dZ2 as shown in FIGS. 19A-D.

Figure 9:
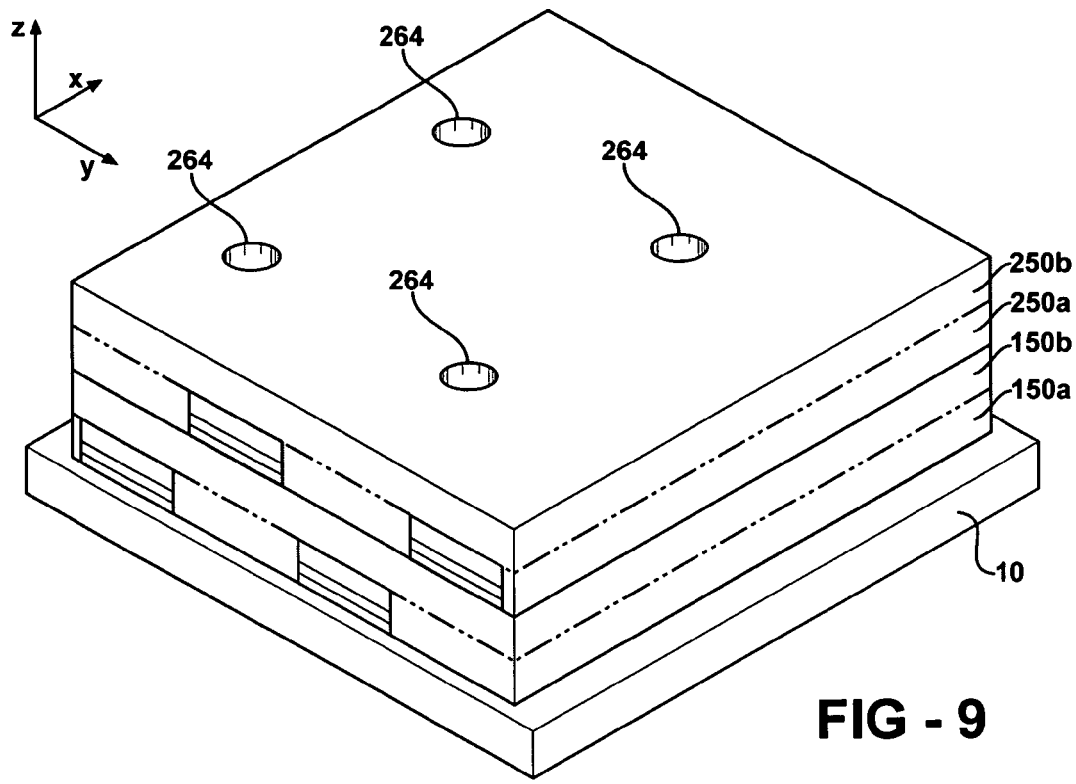

Referring to FIG. 9 (as well as the cross-sectional views shown in FIGS. 19A and 19D), openings 264 are formed through the dielectric layer 250 (which includes dielectric layer portions 250a and 250b) and dielectric layer portion 150b so as to expose the top surfaces of p+regions 116 of lower diodes DL11, DL12, DL21 and DL22. In the embodiment shown, the openings 264 have a circular cross section. However, in other embodiments, the openings may be formed to have a square or rectangular cross section. The openings 264 may be formed using standard lithographic techniques. The width (e.g. diameter) of the openings 264 may be about one feature size F. In other embodiments of the openings may be made to have a smaller width (e.g. diameter) by placing dielectric spacers along the sidewalls of the openings.

Figure 10:
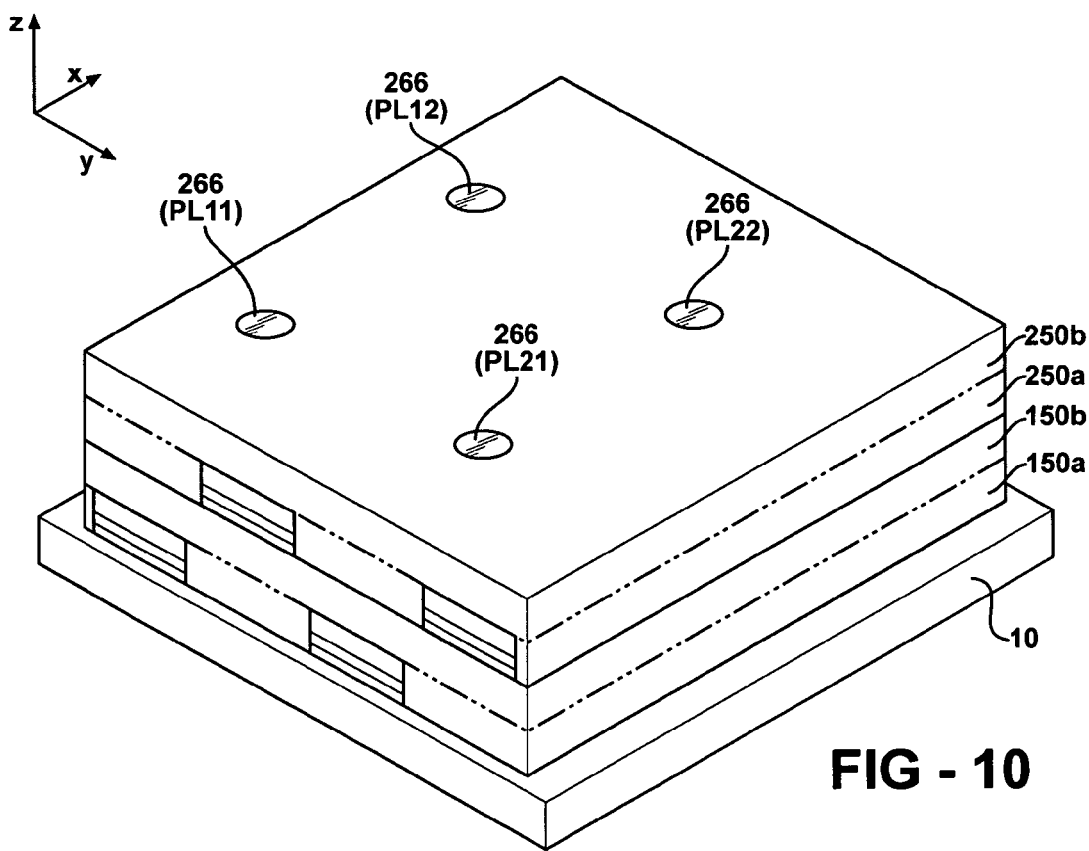

Referring to FIG. 10, each of the openings 264 are filled with a conductive material 266 (which is chemically mechanically polished) to form lower conductive plugs PL11, PL12, PL21 and PL22 that are electrically coupled to the p+ material 116 of the lower diodes DL11, DL12, DL21 and DL22, respectively. The lower conductive plugs have a width (e.g. diameter) that corresponds to the width of the openings 264. Hence, in an embodiment of the invention, the width (e.g. diameter) of the conductive plugs may be about one feature size F.

Figure 11:
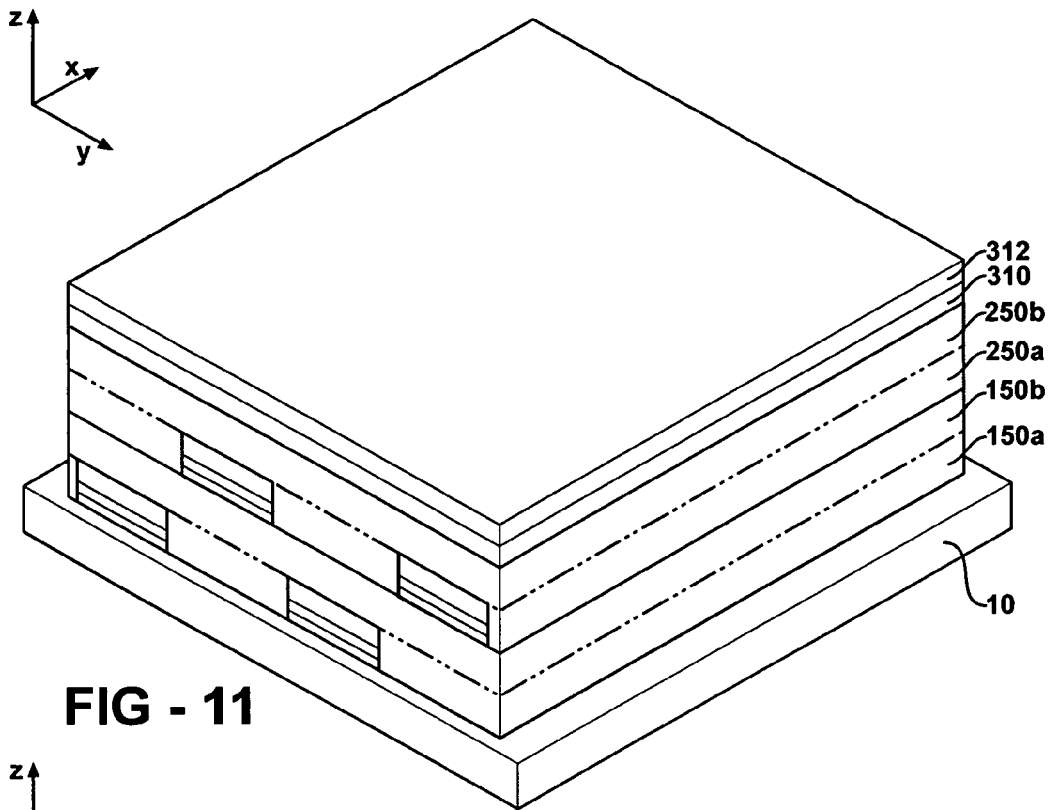

Referring to FIG. 11, a phase-change material 310 is then formed over the top surface of the conductive plugs as well as over the top surface of dielectric layer 250 (more specifically, over dielectric layer portion 250a). A conductive layer 312 is formed over the phase-change material layer 310.

Figure 12:
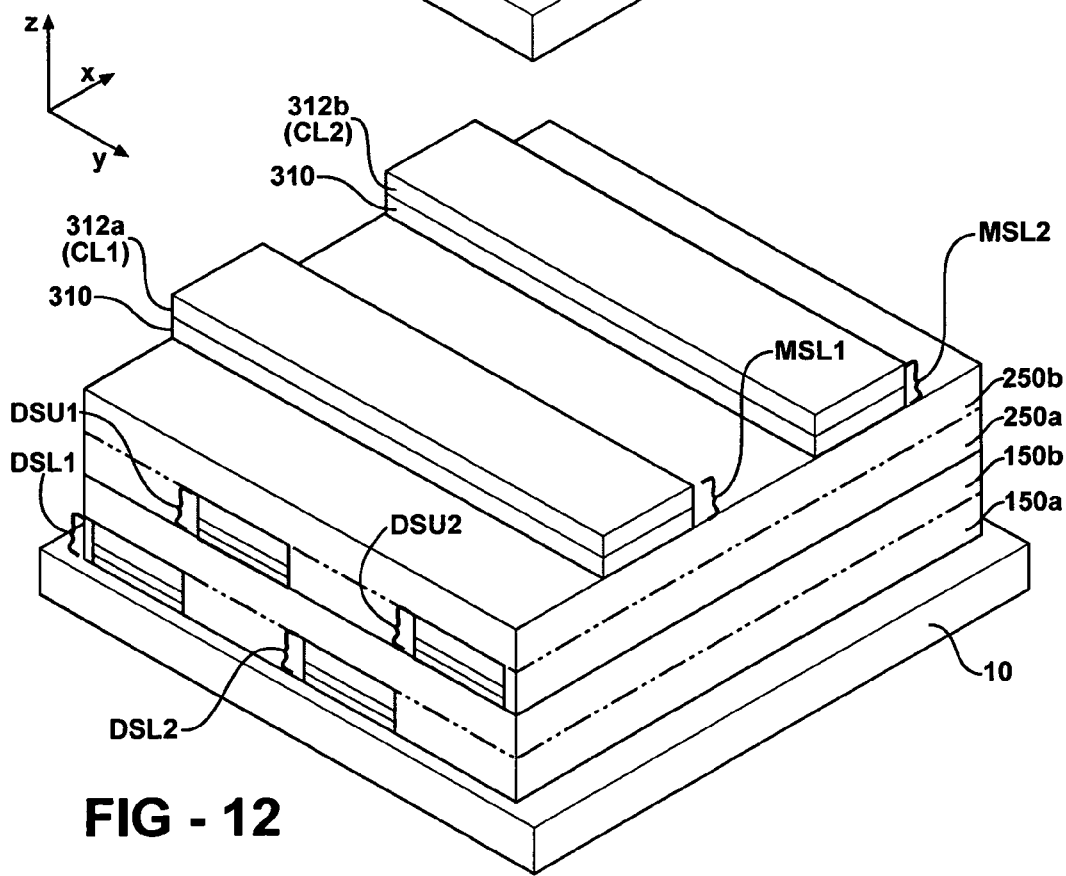

Referring to FIG. 12, the layers 310 and 312 are masked and etched to form lower memory strips MSL1 and MSL2. Lower memory strip MSL1 is positioned so that the phase-change material 310 of lower memory strip MSL1 is formed over the top surface of the lower conductive plug PL11 and over the top surface of lower conductive plug PL21. Likewise, lower memory strip MSL2 is positioned so that the phase-change material 310 of lower memory strip MSL2 is formed over the top surface of lower conductive plug PL12 and over the top surface of lower conductive plug PL22. The lower memory strip MSL1 includes a conductive layer 312a which forms a first lower column line CL1 for the memory array. Likewise, the lower memory strip MSL2 includes a conductive layer 312b which forms a second lower column line CL2 for the memory array.

In an embodiment of the invention, the lower memory strips MSL1 and MSL2 may each be formed so as to have a width in the X-direction of about (5/3)F. Hence, the corresponding lower column lines CL1, CL2 may also have a width in the X-direction of about (5/3)F.

Figure 13:
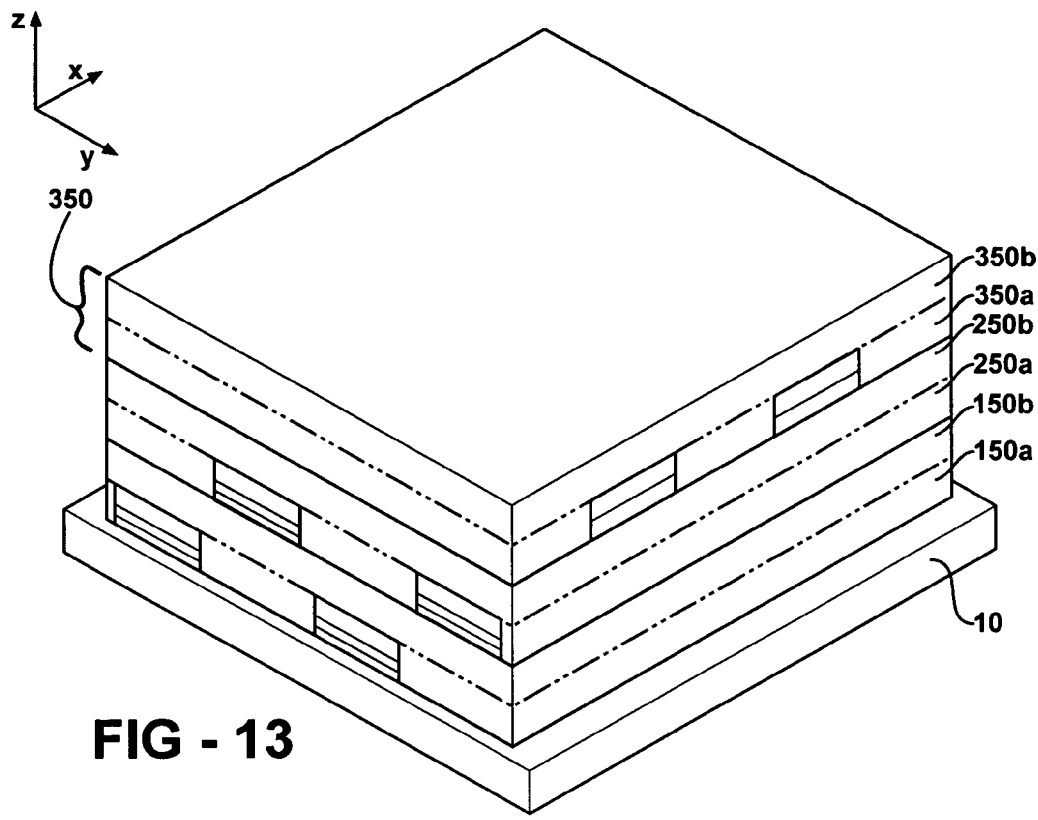

Referring to FIG. 13, a dielectric material 350 is deposited between the lower memory strips MSL1 and MSL2 as well as over the lower memory strips MSL1, MSL2. The dielectric material is then chemically mechanically polished. The dielectric layer 350 may be viewed as having a first portion 350a which fills the gaps between the memory strips as well as a second portion 350b which is formed above the memory strips. The height of the second portion 350b is designated as dZ3 as shown in FIGS. 19A-D.

Figure 14:
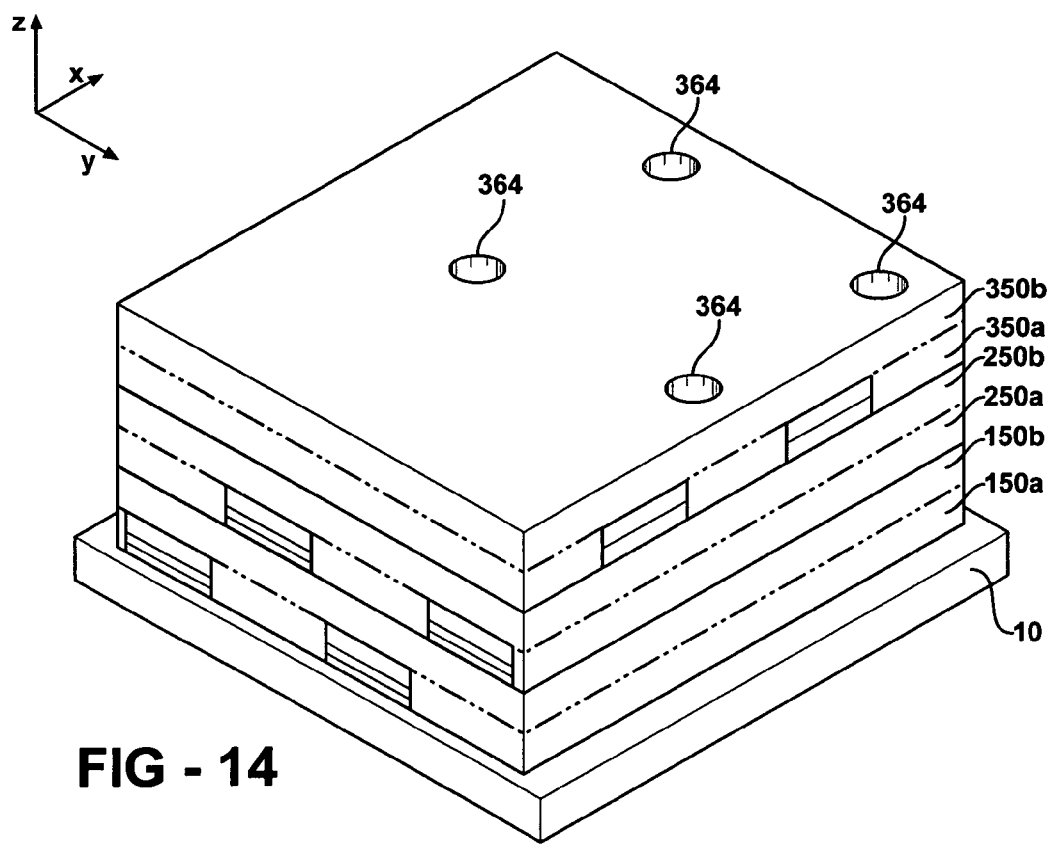

Referring to FIG. 14 (as well as cross-section shown in FIGS. 19B and 19D), openings 364 are formed through the dielectric layer 350 (including both dielectric layer portions 350b and 350a) as well as dielectric layer portion 250b so that the openings 364 expose the top surfaces of the p+ regions 216 of upper diodes DU11, DU12, DU21 and DU22. In the embodiment shown, the openings 364 have a circular cross-section. More generally, the cross-section may be of any shape including, but not limited to, square and rectangular. In an embodiment, the openings 364 may have a width (e.g. a diameter) of about one feature size F. In another embodiment of the invention, the openings may be made smaller by forming dielectric sidewall spacers on the sidewalls of the openings.

Figure 15:
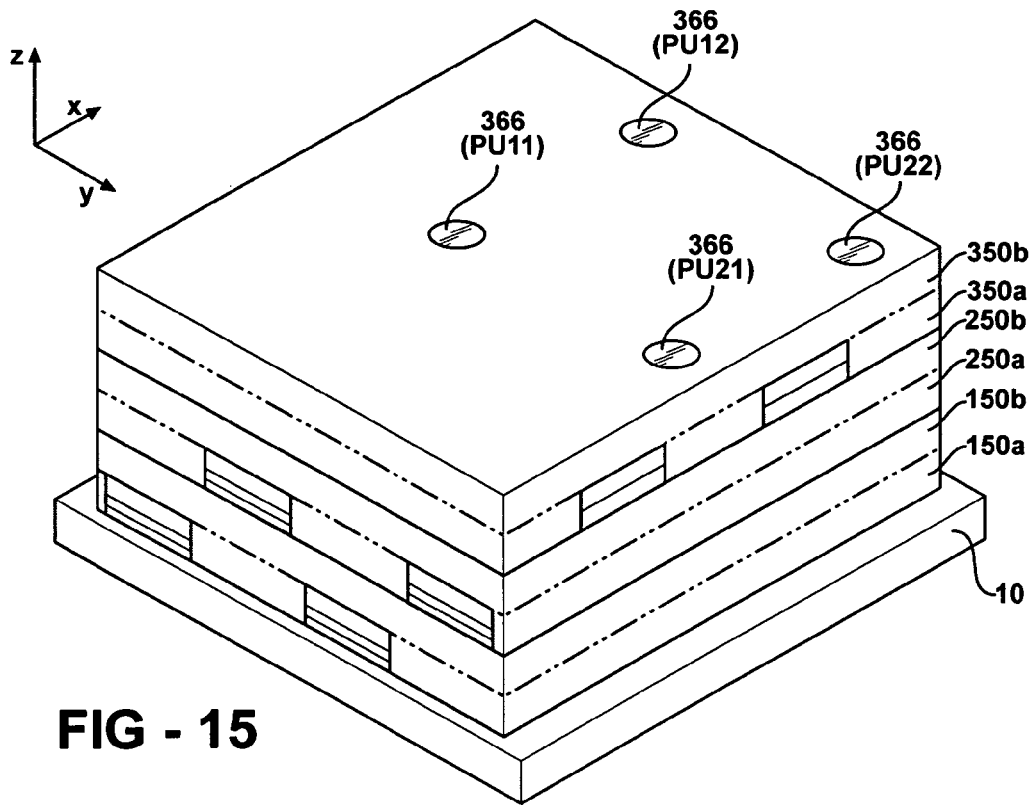

Referring to FIG. 15, each of the openings 364 are filled with a conductive material 366 and the conductive material is chemically mechanically polished (CMP) to form upper conductive plugs PU11, PU12, PU21 and PU22 that are electrically coupled to the top surfaces of the p+ regions 216 of upper diodes DU11, DU12, DU21 and DU22, respectfully. The width of the conductive plugs corresponds to the width of the openings 364. Hence, the width of each of the conductive plugs may be about one feature size F.

Figure 16:
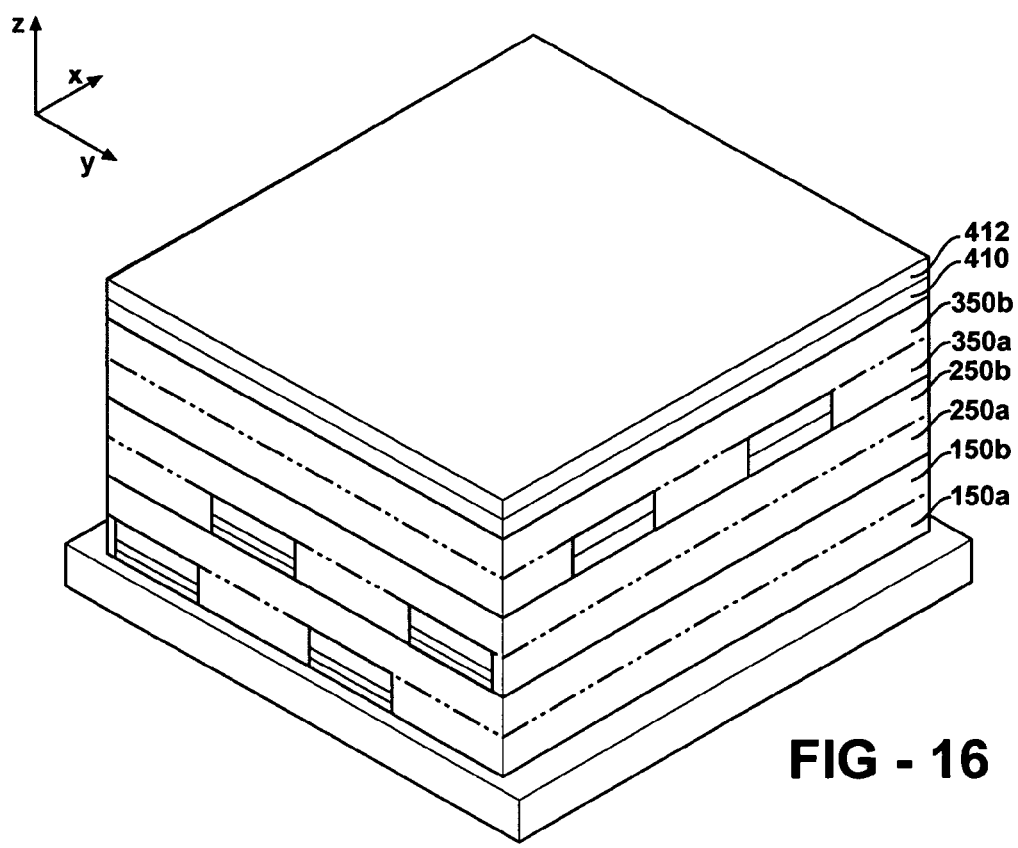

Referring to FIG. 16, a phase-change material 410 is then formed over the top surface of the upper conductive plugs as well as over dielectric layer portion 350b of the dielectric layer 350. A conductive layer 412 is formed over the phase-change material layer 410.

Referring to FIG. 17, the layers 310 and 312 are masked and etched to form upper memory strips MSU1 and MSU2. The upper memory strip MSU1 is positioned so that the phase-change material 410 of upper memory strip MSU1 is formed over the top surface of the upper conductive plug PU11 and over the top surface of upper conductive plug PU21. Likewise, upper memory strip MSU2 is positioned so that the phase-change material 410 of upper memory strip MSU2 is formed over the top surface of upper conductive plug PU12 and over the top surface of upper conductive plug PU22. The upper memory strip MSU1 includes a conductive layer 412a which serves as a first upper column line CU1 for the memory array. The upper memory strip MSU2 includes a conductive layer 412b which serves as a second upper column line CU2 for the memory array.

In an embodiment of the invention, the upper memory strips MSU1 and MSU2 may be formed so as to have a width in the X-direction of about (5/3)F. Hence, the corresponding upper column lines CU1, CU2 may also have a width in the X-direction of about (5/3)F.

In the embodiment shown in FIG. 17, the upper memory strips MSU1, MSU2 are disposed above the lower memory strips MSL1, MSL2. The upper memory strips are vertically separated from the lower memory strips by the thickness of the dielectric layer portion 350b which is dZ3. In the embodiment shown in FIG. 17, the upper memory strips are disposed above the lower memory strips even though the upper memory strips do not overlap the lower memory strips. However, in alternate embodiments of the invention, it is possible that the upper and lower memory strips may overlap.

Referring to FIG. 18, a dielectric layer 500 is formed between upper memory strips MSU1, MSU2 as well as over upper memory strips MSU1 and MSU2. The dielectric layer 500 may be viewed as having a first portion 500a disposed between the upper memory strips MSU1, MSU2 as well as a second portion 500b disposed above the upper memory strips MSU1, MSU2.

As noted above, FIG. 20 shows a view of the three-dimensional memory array from FIG. 18 except that all of the dielectric layers have been removed for clarity. FIG. 20 shows the lower diode strips DSL1, DSL2 as well as the upper diode strips DSU1, DSU2. FIG. 20 also shows the lower memory strips MSL1, MSL2 as well as the upper memory strips MSU1, MSU2. FIG. 20 also shows the lower plugs PL11, PL12, PL21, PL22 as well as upper plugs PU11, PU12, PU21, PU22.

Figure 21A:
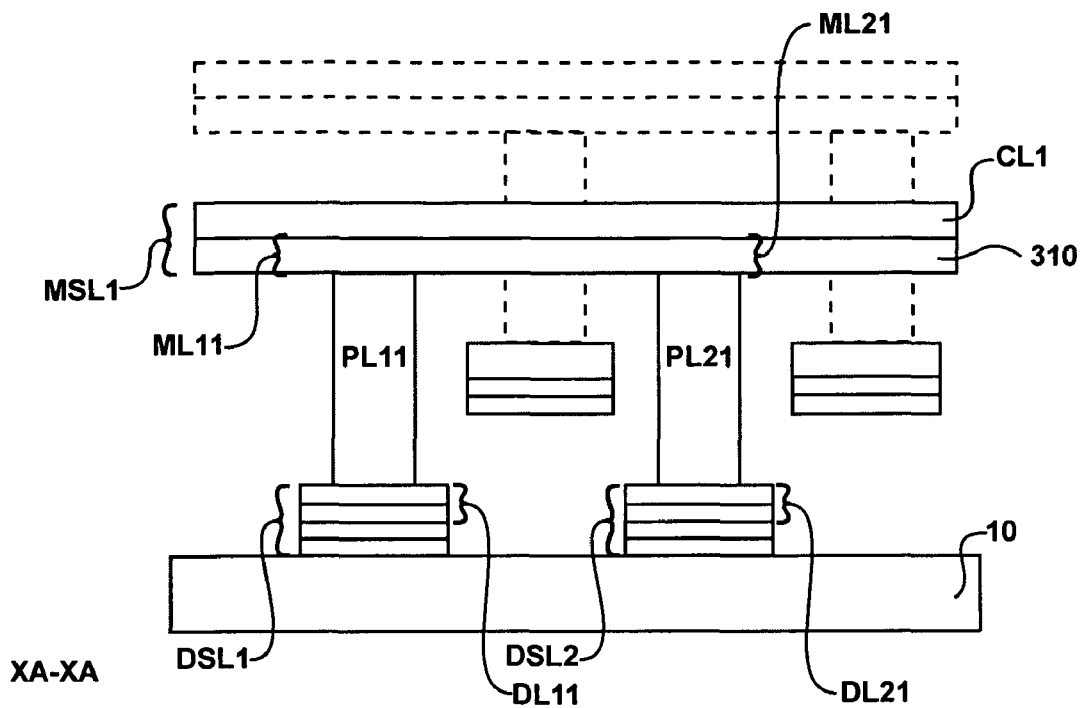
FIG. 21A is a cross-sectional view of the three-dimensional memory array shown in FIG. 20 through the cross-section XA-XA.

FIGS. 21A, 21B, 21C, 21D show cross-sectional views of the memory structure shown in FIG. 20 through the cross-sections XA-XA, XB-XB, XC-XC and XD-XD, respectively. The dashed lines are not part of the cross-section but show background components. For example, FIG. 21A shows the memory structure in FIG. 20 through cross-section XA-XA which goes through the conductive plugs PL11 and PL21

Figure 21B:
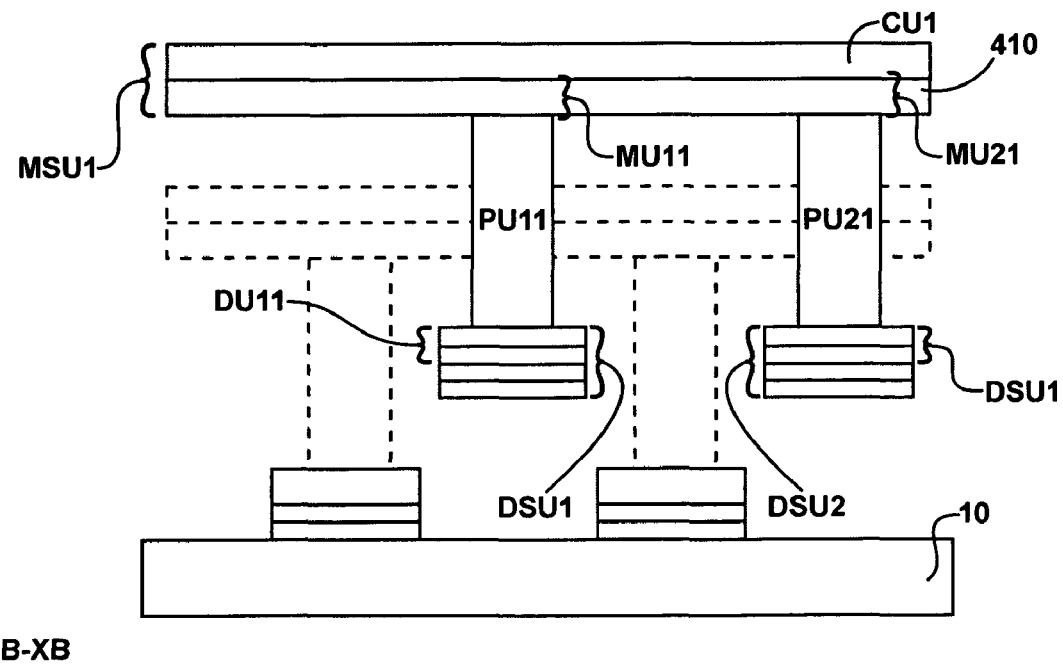
FIG. 21B is a cross-sectional view of the three-dimensional memory array shown in FIG. 20 through the cross-section XB-XB.
Figure 21C:
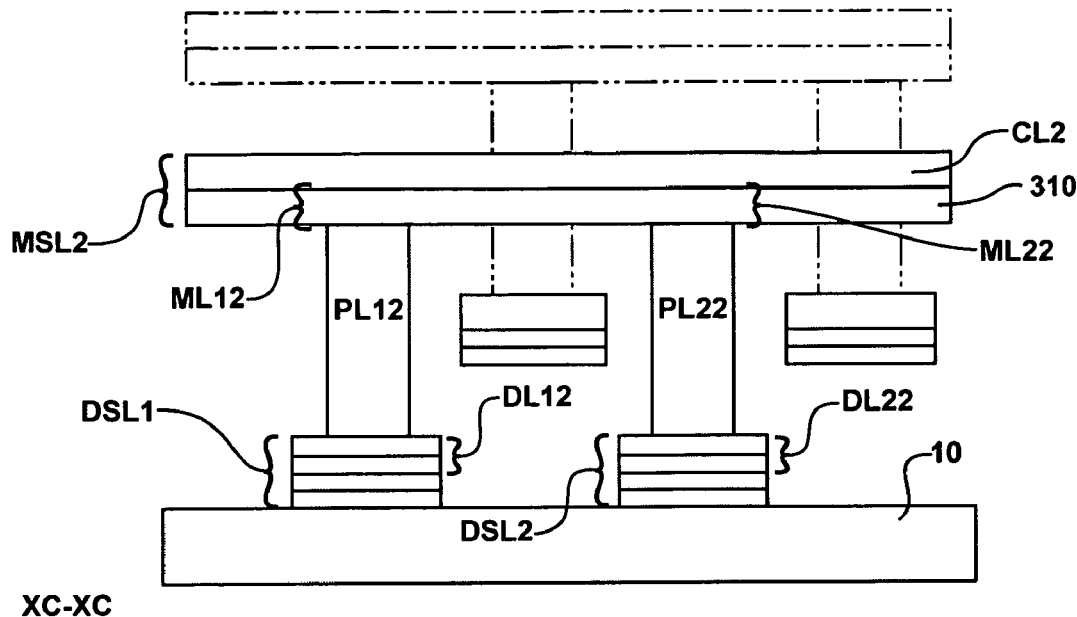
FIG. 21C is a cross-sectional view of the three-dimensional memory array shown in FIG. 20 through the cross-section XC-XC.
Figure 21D:
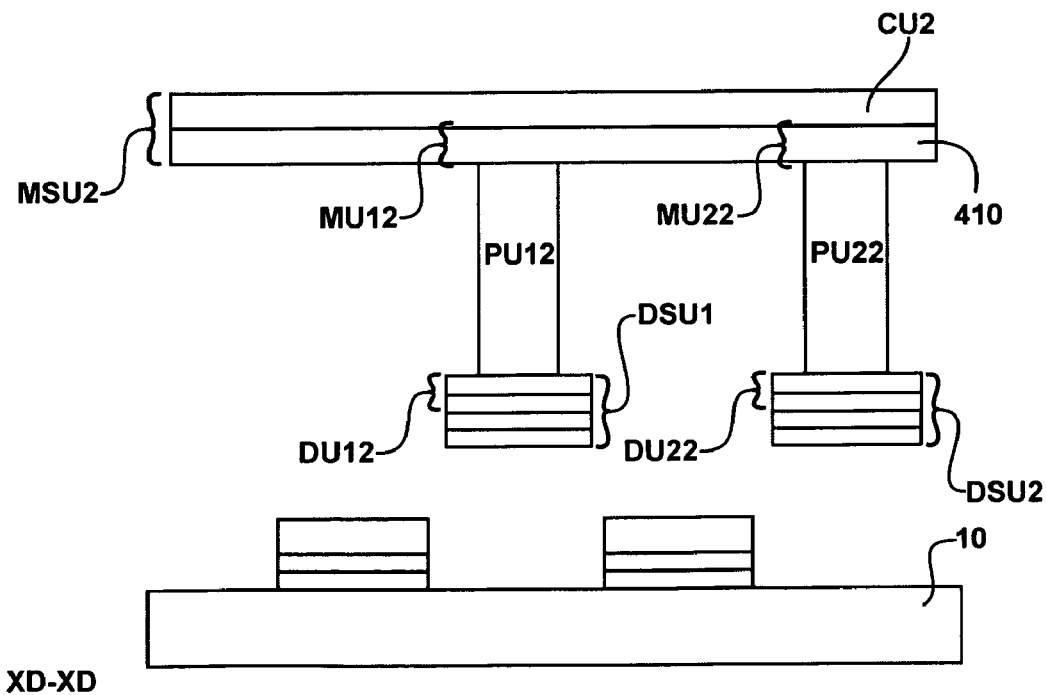
FIG. 21D is a cross-sectional view of the three-dimensional memory array shown in FIG. 20 through the cross-section XD-XD.

(while plugs PU1, PU21 and memory strip MSU1 are shown in the background). FIG. 21B shows the memory structure in FIG. 20 through the cross-section XB-XB which goes through the plugs PU11, PU21 (while plugs PL12, PL22 and memory strip MSL2 are shown as background). FIG. 21C shows the memory structure of FIG. 20 through the cross-section XC-XC which goes through the plugs PL12, PL22 (while plugs PU12, PU22 are shown as background). Likewise, FIG. 21D shows the memory structure of FIG. 20 through the cross-section XD-XD which goes through the plugs PU12, PU22.

The lower memory strips MSL1 and MSL2 in combination with the four lower conductive plugs PL11, PL12, PL21 and PL22 form four lower memory elements ML11, ML12, ML21 and ML22, respectively. Referring to FIG. 21A, portions of lower column line CL1 and lower conductive plug PL11 serve as a top and bottom electrical contacts (also referred to as electrodes), respectively, for the memory element ML11. Likewise, portions of lower column line CL1 and lower conductive plug PL21 serve as a top and bottom electrical contacts, respectively, for the lower memory element ML21. Referring to FIG. 21C, portions of lower column line CL2 and lower conductive plug PL12 serve as a top and bottom electrical contacts, respectively, for the lower memory element ML12. Portions of lower column line CL2 and lower conductive plug PL22 serve as a top and bottom electrical contacts, respectively, for the memory element ML22. Lower memory elements ML11, ML12, ML21 and ML22 are phase-change memory elements comprising phase-change material 310.

The upper memory strips MSU1 and MSU2 in combination with the four upper conductive plugs PU11, PU12, PU21 and PU22 form four upper memory elements MU11, MU12, MU21 and MU22, respectively. Referring to FIG. 21B, portions of upper column line CU1 and upper conductive plug PU11 serve as a top and bottom electrodes, respectively, for the memory element MU1. Electrodes may also be referred to as electrical contacts. Portions of upper column line CU1 and upper conductive plug PU21 serve as a top and bottom electrodes, respectively, for the upper memory element MU21. Referring to FIG. 21D, portions of upper column line CU2 and upper conductive plug PU12 serve as a top and bottom electrodes, respectively, for the upper memory element MU12. Portions of upper column line CU2 and upper conductive plug PU22 serve as a top and bottom electrodes, respectively, for the memory element MU22. Upper memory elements MUW1, MU12, MU21 and MU22 are phase-change memory elements comprising phase-change material 410.

Figure 22:
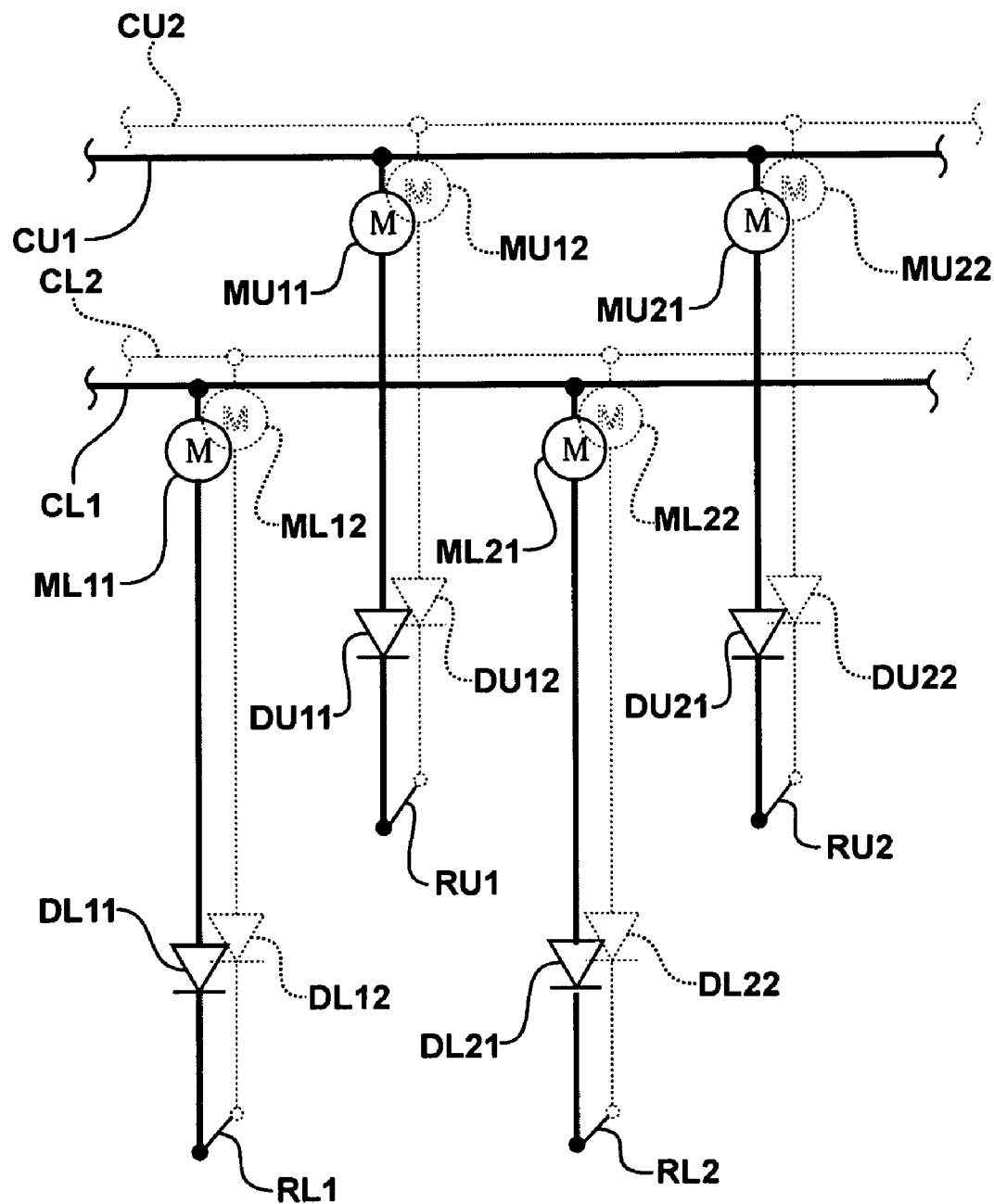
FIG. 22 shows a schematic diagram of the three-dimensional memory array shown in FIG. 20.

FIG. 22 is a schematic diagram of the three-dimensional memory array from FIGS. 18 and 20. Referring to FIG. 22, it is seen that each of the diodes is electrically coupled in series with a corresponding memory element to form a corresponding memory cell. Each of the lower diodes is electrically coupled to a corresponding lower memory element. Diode DL11 is electrically coupled in series with memory element ML11 by conductive plug PL11 between row line RL1 and column line CL1. Diode DL12 is electrically coupled in series with memory element ML12 by conductive plug PL12 between row line RL1 and column line CL2. Diode DL21 is electrically coupled in series with memory element ML21 by conductive plug PL21 between row line RL2 and column line CL1. Diode DL22 is electrically coupled in series with memory element ML22 by conductive plug PL22 between row line RL2 and column line CL2.

Likewise, the upper diodes are electrically coupled to corresponding upper memory elements. Diode DU11 is electrically coupled in series with memory element MU11 by conductive plug PL11 between row line RU1 and column line CU1. Diode DU12 is electrically coupled in series with memory element MU12 by conductive plug PU12 between row line RU1 and column line CU2. Diode DU21 is electrically coupled in series with memory element MU21 by conductive plug PU21 between row line RU2 and column line CU1. Diode DU22 is electrically coupled in series with memory element MU22 by conductive plug PU22 between row line RU2 and column line CU2.

FIG. 22 shows that the three-dimensional memory array comprises four device levels. The first device level Device Level 1 includes the four lower diodes DL11, DL12, DL21 and DL22. The second device level Device Level 2 includes the four upper diodes DU11, DU12, DU21 and DU22. The third device level Device Level 3 includes the four lower memory elements ML11, ML12, ML21 and ML22. The fourth device level Device Level 4 includes the four upper memory elements MU11, MU12, Mu21 and MU22. Each of the device levels is formed above the preceding device level. That is, Device Level 2 is formed above Device Level 1, Device Level 3 is formed above Device Level 2, and Device Level 4 is formed above Device Level 3. In one embodiment of the invention, each device level of elements is arranged in a horizontally disposed layer above the substrate. Preferably, there is some vertical distance separating each device level from the adjacent device level.

Referring again to the cross-sectional views of FIG. 19A through 19D (and, more specifically to FIGS. 19A and 19B), it is seen that the upper diode strips DSU1, DSU2 are disposed above the lower diode strips DSL1, DSL2 and separated from the lower diodes strips DSL1, DSL2 by a distance dZ1 in the Z-direction. The distance dZ1 is equal to the thickness of the dielectric layer portion 150b.

It is preferable that the thickness of the dielectric layer portion 150b is greater than 0 (so that the distance dZ1 is also greater than 0). It is possible that the thickness of the dielectric layer portion 150b be small or relatively thin.

FIGS. 19A-D also show that, it is seen that the lower memory strips MSL1, MSL2 are disposed above the upper diode strips DSU1, DSU2 and separated from the upper diode strips by a distance dZ2 in the Z-direction. The distance is equal to the thickness of the dielectric layer portion 250b. The distance dZ2 is preferably greater than 0 so that the dielectric layer portion 250b has some thickness, however, it is possible that dZ2 be relatively small such that the thickness of the of the dielectric layer portion 250b is relatively thin.

It is also seen that the upper memory strips MSU1, MSU2 are disposed above the lower memory strips MSU1, MSL2 and separated from the lower memory strips by a distance dZ3 in the Z-direction. The distance dZ3 is equal to the thickness of the dielectric layer portion 350b. The distance dZ3 is preferably greater than 0 so that the dielectric layer portion 350b has some thickness. However, it is possible that dZ3 be relatively small such that the thickness of the dielectric layer portion 350b is relatively thin.

FIG. 23A shows a top view of the memory array structure from FIG. 20. FIG. 23A shows the lower diode strips DSL1, DSL2 (and the corresponding lower row lines RL1, RL2), the upper diode strips DSU1, DSU2 (and the corresponding upper row lines RU1, RU2), the lower memory strips MSL1, MSL2 (and the corresponding lower column lines CL1, CL2), the upper memory strips MSU1, MSU2 (and the corresponding upper column lines CU1, CU2), lower plugs PL11, PL12, PL21, PL22 and upper plugs PU11, PU12, PU21, PU22. FIG. 23A also shows the locations of the lower diodes DL11, DL12, DL21 and DL22 as well as the locations of the upper diodes DU11, DU12, DU21 and DU22.

Referring to FIG. 23A as well as FIGS. 19A-D it is seen that the upper row lines RU1, RU2 are separated from the lower row lines RL1, RL2 in the Y-direction by the distance dY1. Likewise, the upper diode strips DSU1, DSU2 are laterally separated from the lower diodes strips DSL1, DSL2 in the Y-direction by a distance dY1.

Also, the upper column lines CU1, CU2 are separated from the lower column lines CL1, CL2 in the X-direction by the distance dX1. Likewise, the upper memory strips MSU1, MSU2 are separated from the lower memory strips MSL1, MSL2 in the X-direction by a distance dX1. In addition, each upper diode DU11, DU21, DU12, DU22 is separated from its closest neighboring lower diodes DL11, DL21, DL12, DL22 by a distance dX1 in the X-direction and a distance dY1 in the Y-direction.

In the embodiment shown in FIGS. 23A and 19A-D, dY1 is greater than 0. In this case, there is separation (and no overlap) between the upper row lines RU1, RU2 and lower row lines RL1, RL2. Likewise, there is separation (and no overlap) between the upper diode strips and the lower diode strips. In the embodiment of FIGS. 23A and 19A-D, dX1 is also greater than 0. In this case, there is separation (and no overlap) between the upper column lines CU1, CU2 and the lower column lines CL2, CL2. Likewise, there is also separation (and no overlap) between the upper memory strips DSU1, DSU2 and lower memory strips DSL1, DSL2.

However, in other embodiments of the invention it is possible that the distances dX1 and/or dY1 be equal to 0. Also, in still further embodiments of the invention, it is possible that dX1 and/or dY1 be less than 0. If dY1 is less than 0, then the upper row lines overlap the lower row lines (and the corresponding upper diode strips overlap the lower diode strips). If dX1 is less than 0, then the upper column lines overlap the lower column lines (and the upper memory strips overlap the lower memory strips).

Figure 23B:
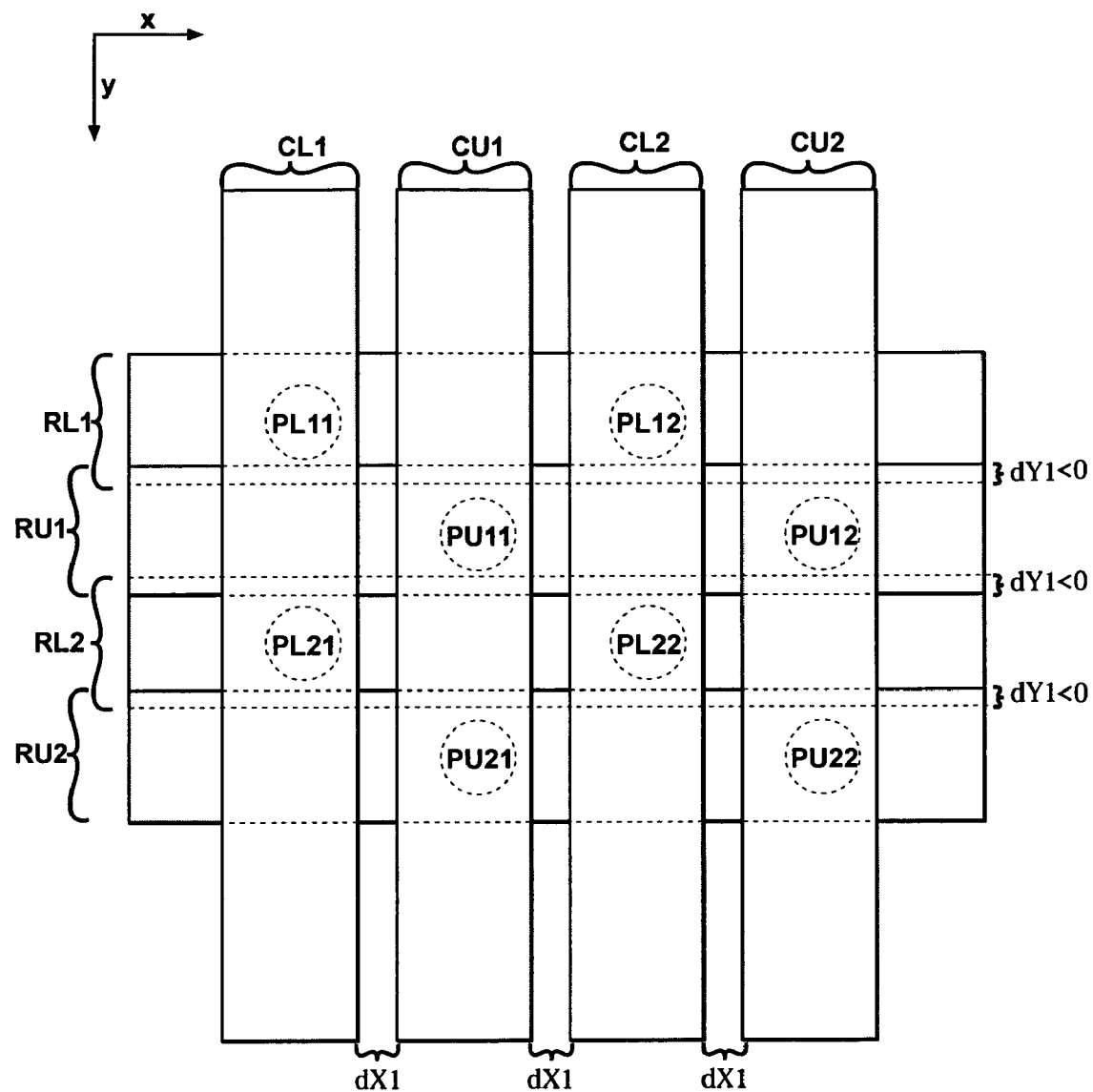
FIG. 23B is a top view of an embodiment of a three-dimensional memory array of the present invention where there is overlap between the row lines but no overlap between the column lines.
Figure 23C:
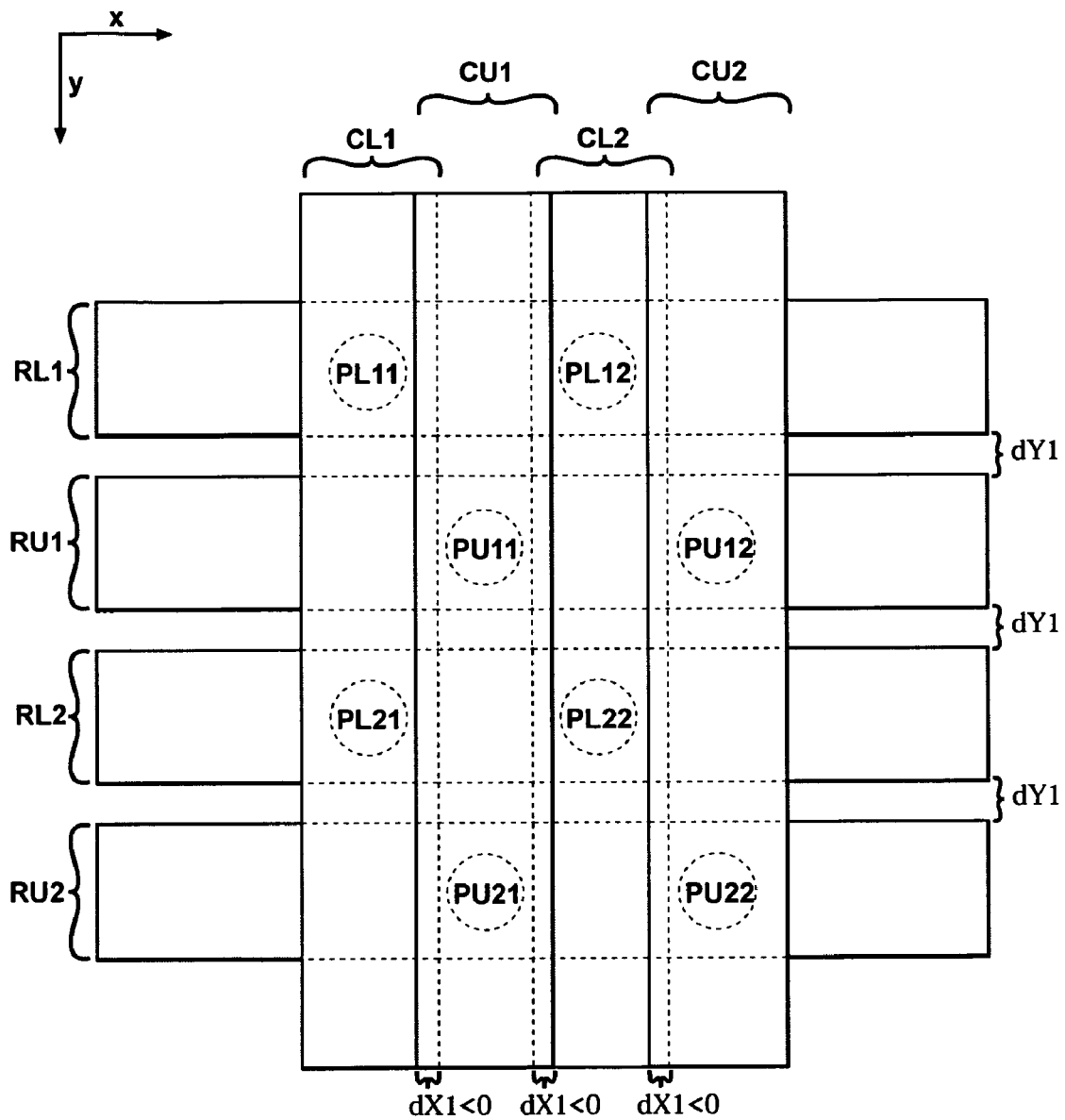
FIG. 23C is a top view of an embodiment of a three-dimensional memory array of the present invention where there is no overlap between the row lines but overlap between the column lines.

FIG. 23B shows an embodiment of the invention where dY1 is less than 0 and dX1 is greater than 0. In this embodiment, the upper row lines overlap the lower tow lines (and the corresponding upper diode strips overlap the corresponding lower diode strips). Another embodiment of the invention is shown in FIG. 23C where dY1 is greater than 0 and dX1 is less than 0. In this case, the upper column lines overlap the lower column lines (and the corresponding upper memory strips overlap the corresponding lower memory strips).

Figure 23D:
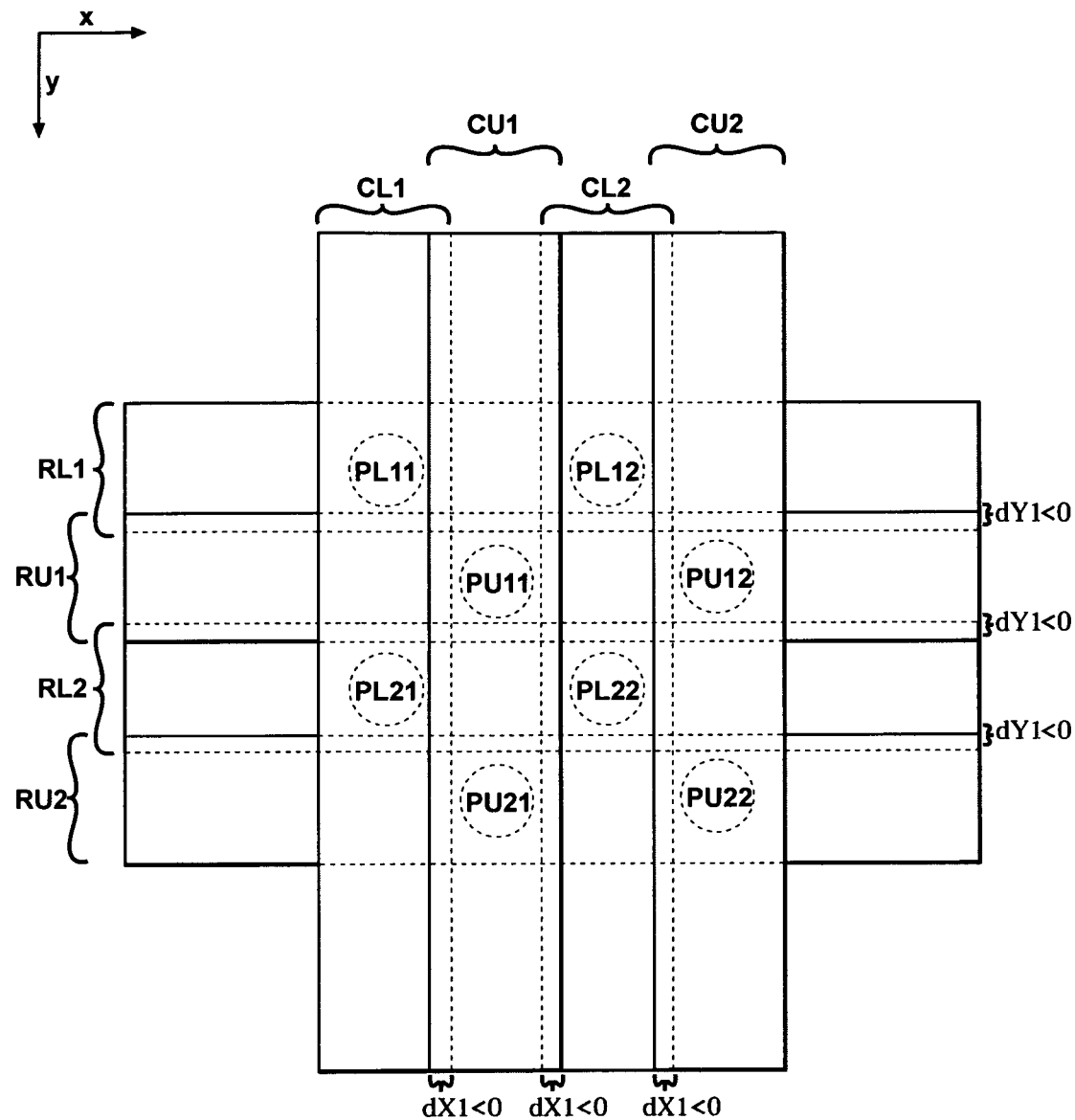
FIG. 23D is a top view of an embodiment of a three-dimensional memory array of the present invention where there is overlap between the row lines and overlap between the column lines.

Another embodiment of the invention is shown in FIG. 23D where both dX1 is less than 0 and dY1 is less than 0. In this case, the upper row lines overlap the lower row lines and the upper column lines overlap the lower column lines. Likewise, the upper diode strips overlap the lower diode strips and the upper memory strips overlap the lower memory strips. In addition, when both dX1 is less than 0 and dY1 is less than 0, then the upper diodes overlap the lower diodes.

Figure 19A:
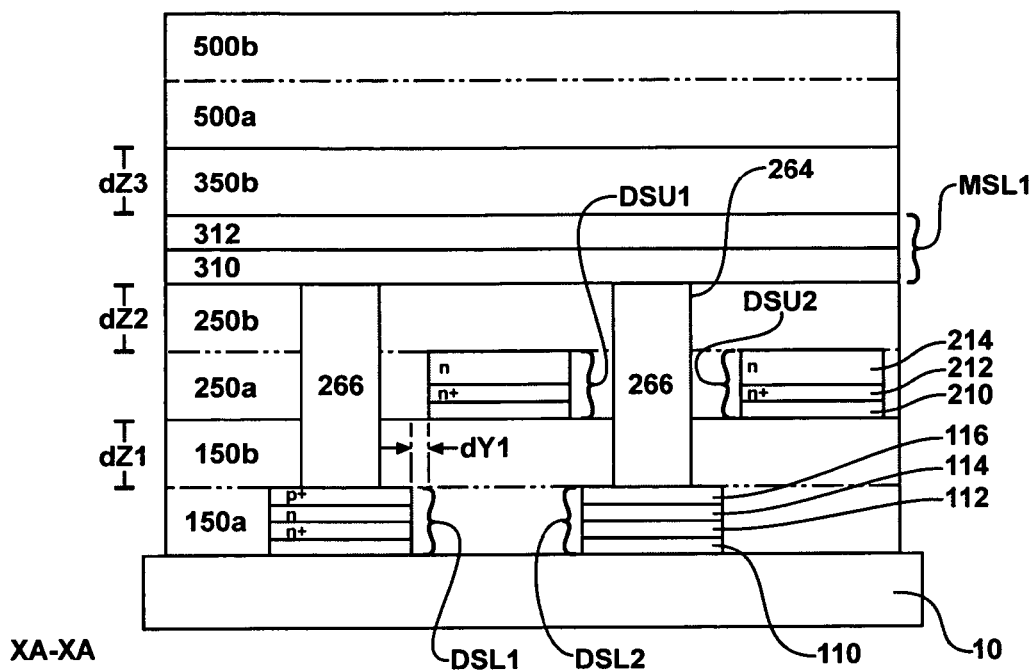
FIG. 19A is cross-sectional view through XA-XA of the three-dimensional memory array shown in FIG. 18.
Figure 19B:
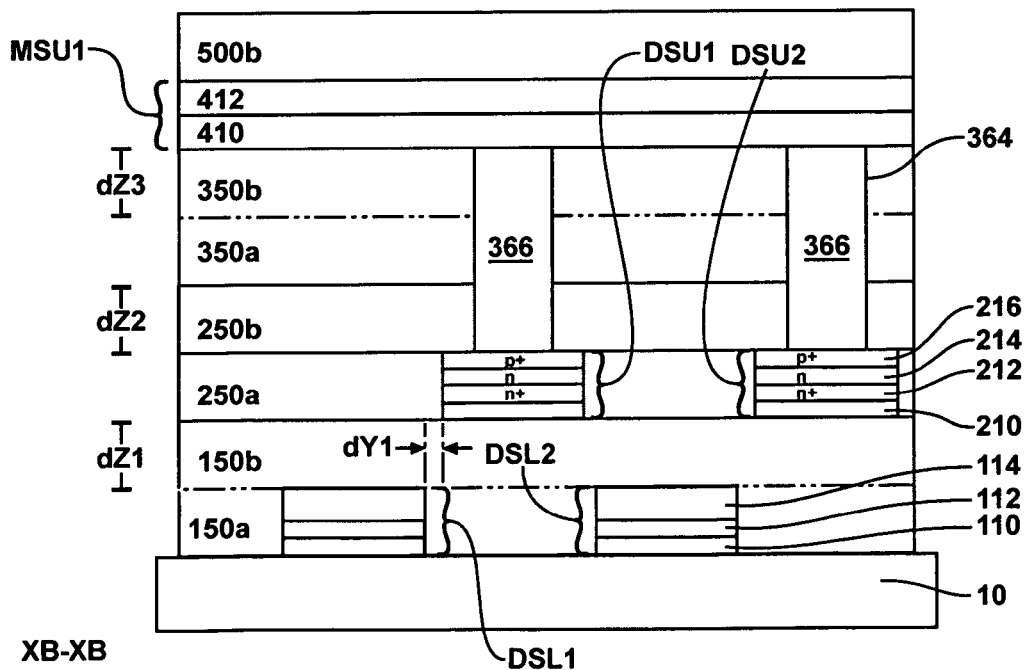
FIG. 19B is a cross-sectional view through XB-XB of the three-dimensional memory array shown in FIG. 18.
Figure 19C:
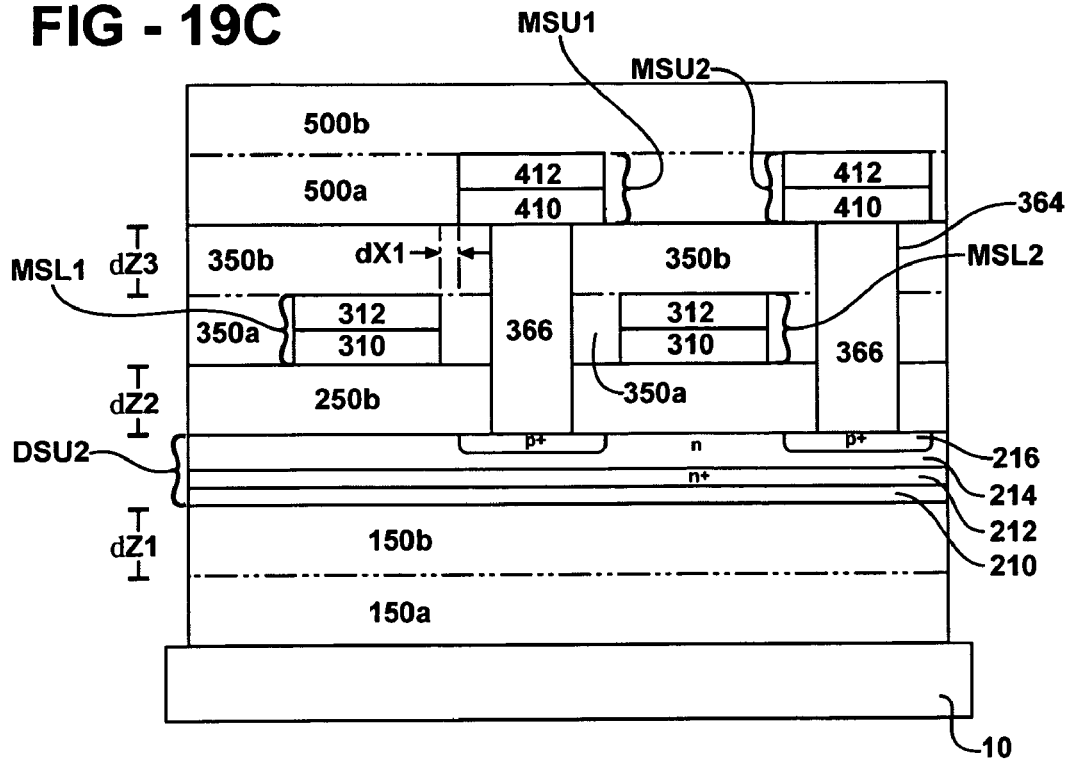
FIG. 19C is a cross-sectional view through YA-YA of the three-dimensional memory array shown in FIG. 18.
Figure 19D:
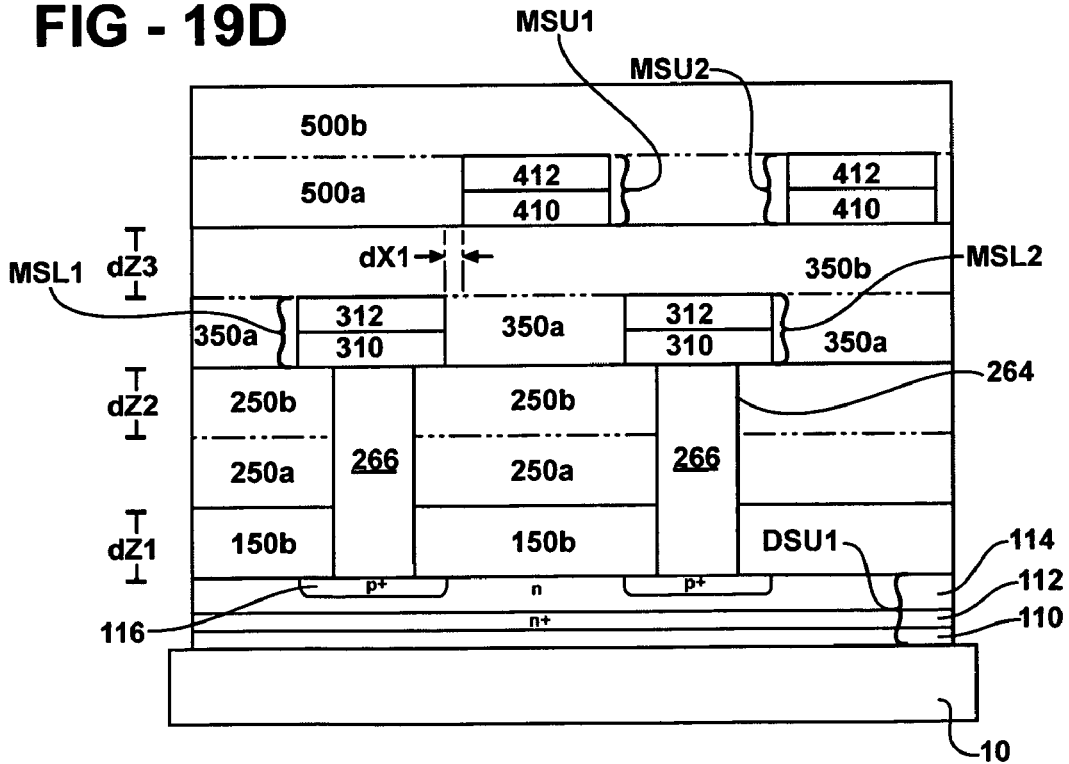
FIG. 19D is a cross-sectional view through YB-YB of the three-dimensional memory array shown in FIG. 18.
Figure 19A:
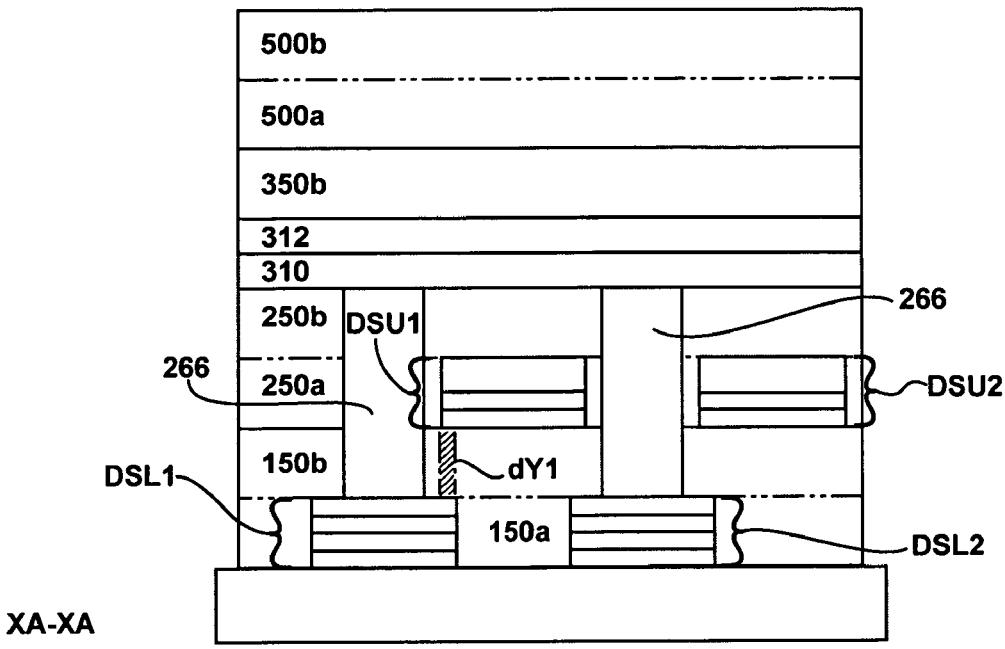
Figure 19B:
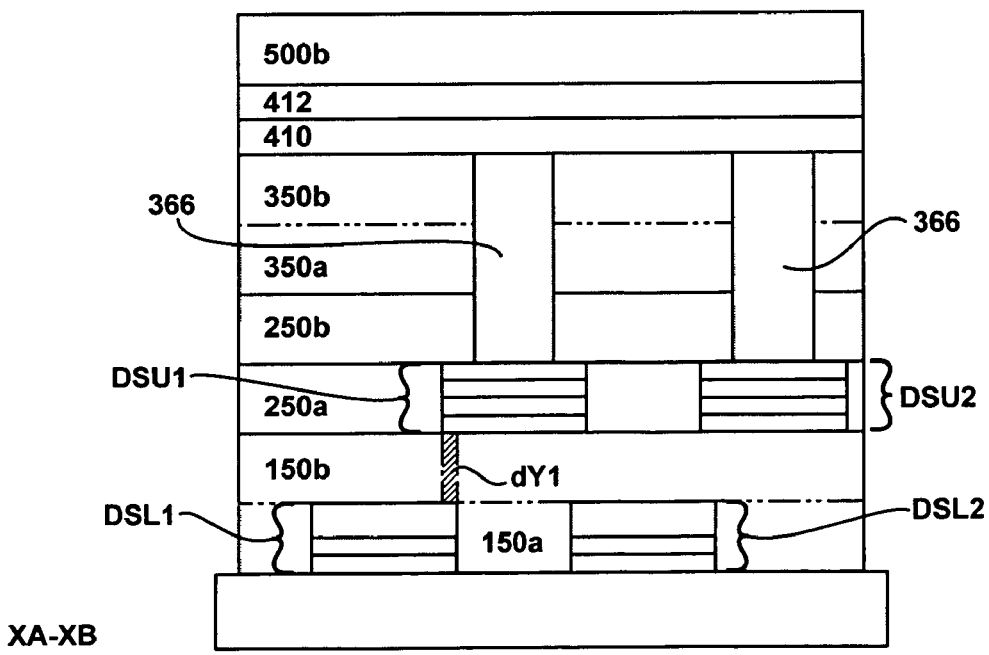
Figure 19C:
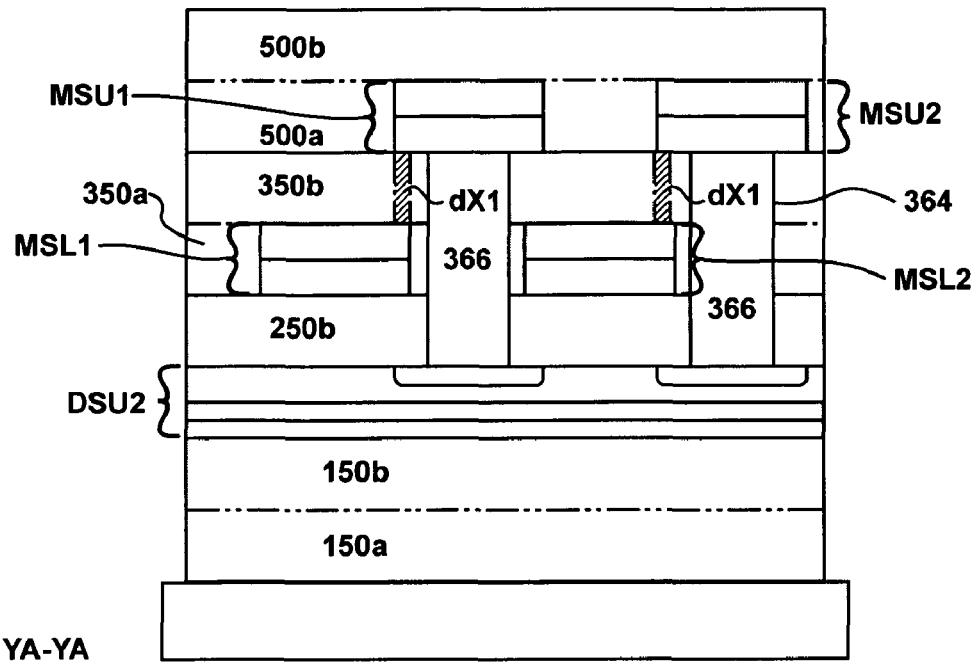
Figure 19D:
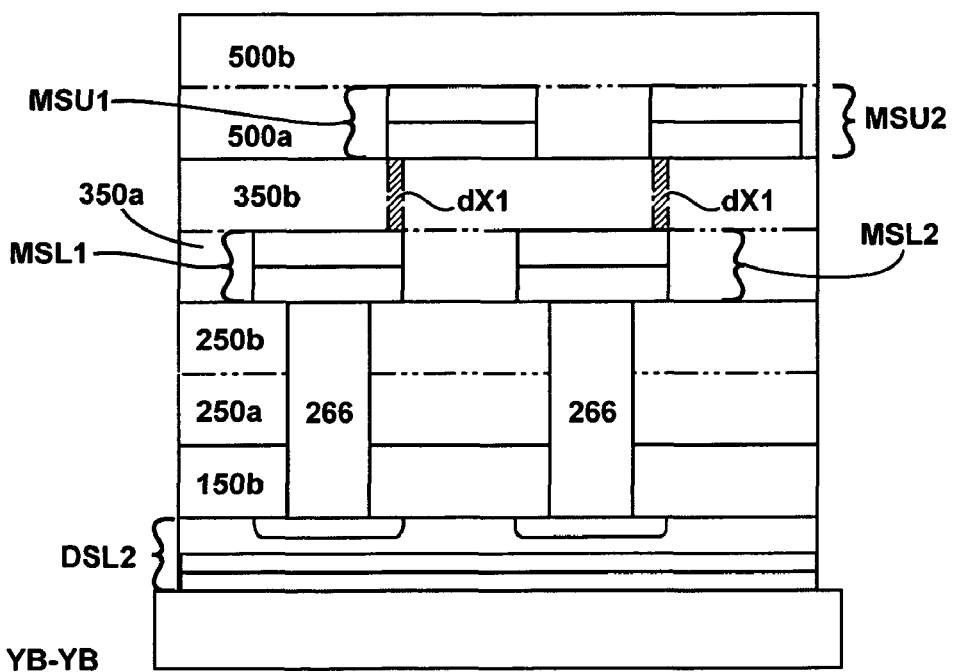

FIGS. 19A' and 19B' shows cross-sections of the memory array through the cross-sections XA-XA and XB-XB, respectively when dY1 is less than 0 and the upper and lower row lines overlap (and the corresponding upper and lower diode strips overlap). Referring to FIG. 19A', it is seen how upper diode strip DSU1 overlaps lower diode strip DSL1 and also overlaps lower diode strip DSL2. It is also seen how upper diode strip DSU2 overlaps lower diode strip DSL2. Likewise, FIGS. 19C' and 19D' show cross-sectional views of the memory array through the cross-section YA-YA, YB-YB, respectively when dX1 is less than 0 and the upper and lower column lines overlap (and the corresponding upper and lower memory strips-overlap).

It is noted that the upper and lower row lines may overlap provided that the upper row lines do not contact the conductive plug material 266. Likewise, the upper and lower column lines may overlap provided that the lower column lines do not contact the conductive plug material 366. Overlap of the row lines and/or the column lines may be used to further increase the density of the memory array.

In all of the embodiments shown in the top view of FIGS. 23A-D (as well as cross-sectional views of FIGS. 19A-D and the cross-sectional views of FIGS. 19A'-D') the upper row lines and lower row lines are staggered in the Y-direction. The upper and lower row lines alternate such that a lower row line (e.g. RL1) is followed by an upper row line (e.g. RU1), and an upper row line (e.g. RU1) is following by a lower row line (e.g. RL2).

Also, the upper column lines and lower column lines are staggered in the X-direction. The upper and lower column lines alternate such that a lower column line (e.g. CL1) is followed by an upper column line (e.g. CU1), and an upper column line (e.g. CU1) is following by a lower column line (e.g. CL2). Hence, a staggered arrangement of the row lines may be achieved with or without overlap. Likewise, a staggered arrangement of the column lines may be achieved with or without overlap.

In the embodiments shown in FIG. 23A-D, the footprints (e.g. projections onto the substrate) of the lower diodes form a checkerboard configuration with the footprints of the upper diodes. This checkerboard configuration may be achieved with or without overlap between the upper and lower diodes. In the embodiments shown in FIGS. 23A-D, the lower diodes DL11, DL12, DL21, DL22 are arranged in rows and columns. Likewise, the upper diodes DU11, DU12, DU21, DU22 are also arranged in rows and columns. The upper diodes are staggered with respect to the lower diodes. Also, the upper diodes are staggered diagonally with respect to the lower diodes. The upper diodes alternate with the lower diodes along diagonals. For example, the lower diode DL11 is followed by the upper diode DU11. The upper diode DU11 is followed by a lower diode DL22. The lower diode DL22 is followed by the upper diode DU22.

Likewise, in the embodiments shown in FIGS. 23A-D, the upper memory elements may be staggered with respect to the lower memory elements. Likewise, in the embodiments shown in FIGS. 23A-D, the upper memory elements may alternate with the lower memory elements along the diagonals. The lower memory elements may be diagonally staggered with respect to the upper memory elements.

In the embodiment of the invention shown in FIGS. 23A-D, the lower row lines RL1, RL2 and the upper row lines RU1, RU2 each have a width $W_y$ in the Y-direction (likewise, the corresponding lower diode strips and the upper diode strips each have a width $W_y$ in the Y-direction. Also, the lower column lines CL1, CL2 and the upper column lines CU1, CU2 each have a width $W_x$ the X-direction (likewise, the corresponding lower memory strips and upper memory strips each have a width $W_x$ in the X-direction). The lower and upper diodes have a lateral dimension $W_x$ in the X-direction and a lateral dimension $W_y$ in the Y-direction. The dimension $W_x$ as well as the dimension $W_y$ may be the same dimension W. In an embodiment of the invention, the dimension W may be around (5/3)F. It is noted that in general, the dimensions (e.g., widths, lengths, heights, thicknesses) of each of the row lines, column lines, diode strips, memory strips, diodes and memory elements is not limited to any particular dimension. In an embodiment of the invention, it is even possible that the widths of two or more column lines (or two or more row lines) are different.

Figure 25A:
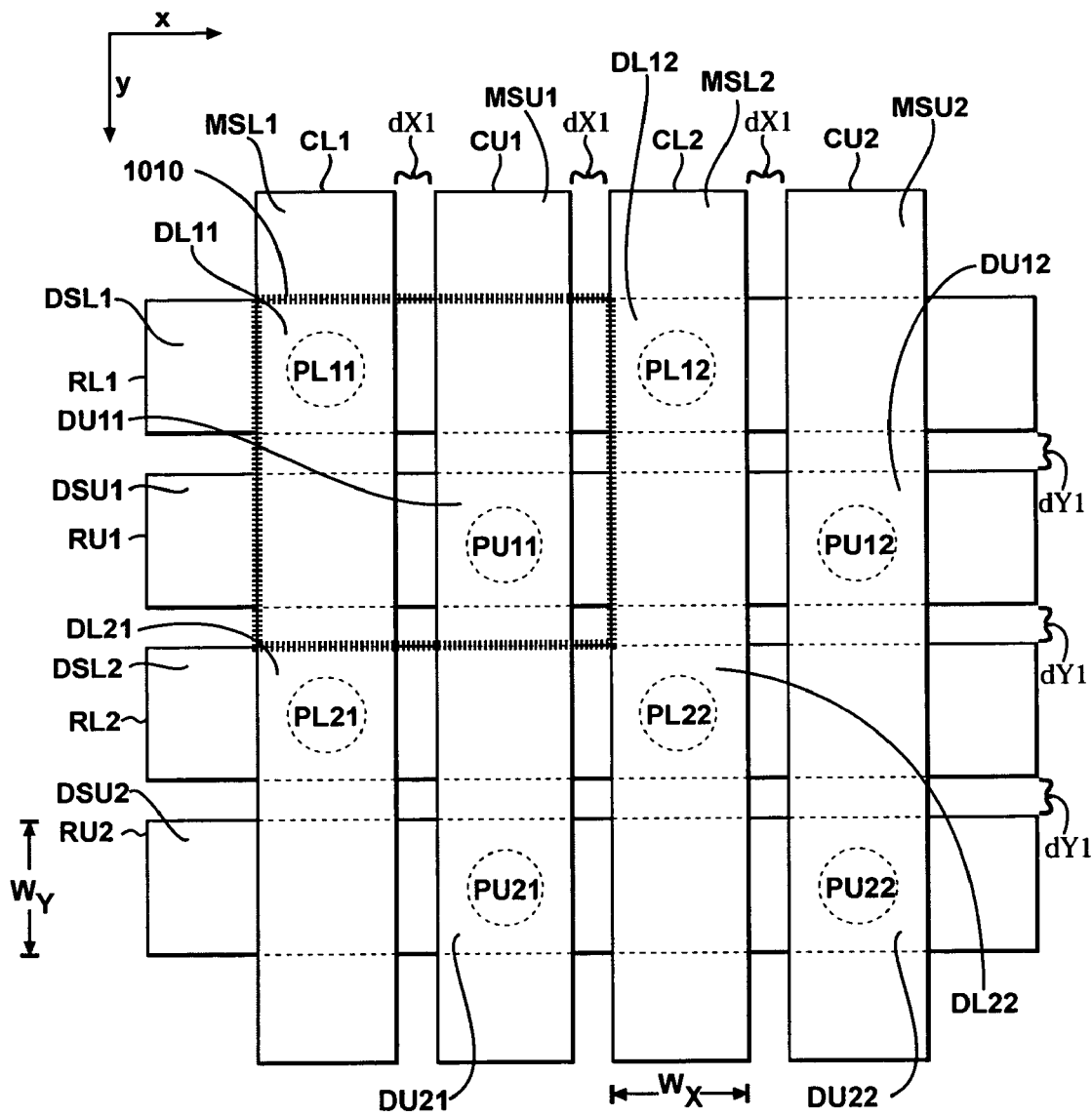
FIG. 25A is a top view of a three-dimensional memory array from FIG. 23A showing a lateral cross section of a unit volume.

FIG. 25A shows a top view of the three-dimensional memory array from FIG. 23A. FIG. 25A shows a top view of a unit volume 1010 of the three-dimensional array. The unit volume includes two memory cells. The unit volume 1010 has a lateral dimension in the X-direction of $2W_x+2dX1$. The unit volume 1010 has a lateral dimension in the Y-direction of $2W_y+2dY1$. Since the unit volume includes two memory cells, the cell size is one-half the size of the footprint of the unit volume.

$$dX1>0 \text{ and } dY1>0 \quad \text{Case 1}$$

(separation in both the X-direction and Y-direction)

In this case, footprint size is $4(W_x+dX1)(W_y+dY1)$, and cell size is $2(W_x+dX1)(W_y+dY1)$ It is seen that even though dX1>0 and dY1>0, the cell size of the three-dimensional array may be made less than $4(W_x)(W_y)$ by appropriately choosing the values of dX1 and dY1 (e.g. making them small enough). Likewise, the cell size of the three-dimensional array may be made less than $3(W_x)(W_y)$ by choosing the appropriate values of dX1 and dY1.

$$dX1=dY1=0 \quad \text{Case 2}$$

In this case, footprint size is $4(W_x)(W_y)$, and cell size is $2(W_x)(W_y)$ $$dX1<0 \text{ and/or } dY1<0 \quad \text{Case 3}$$

(overlap in either the X-direction and/or Y-direction)

Figure 25B:
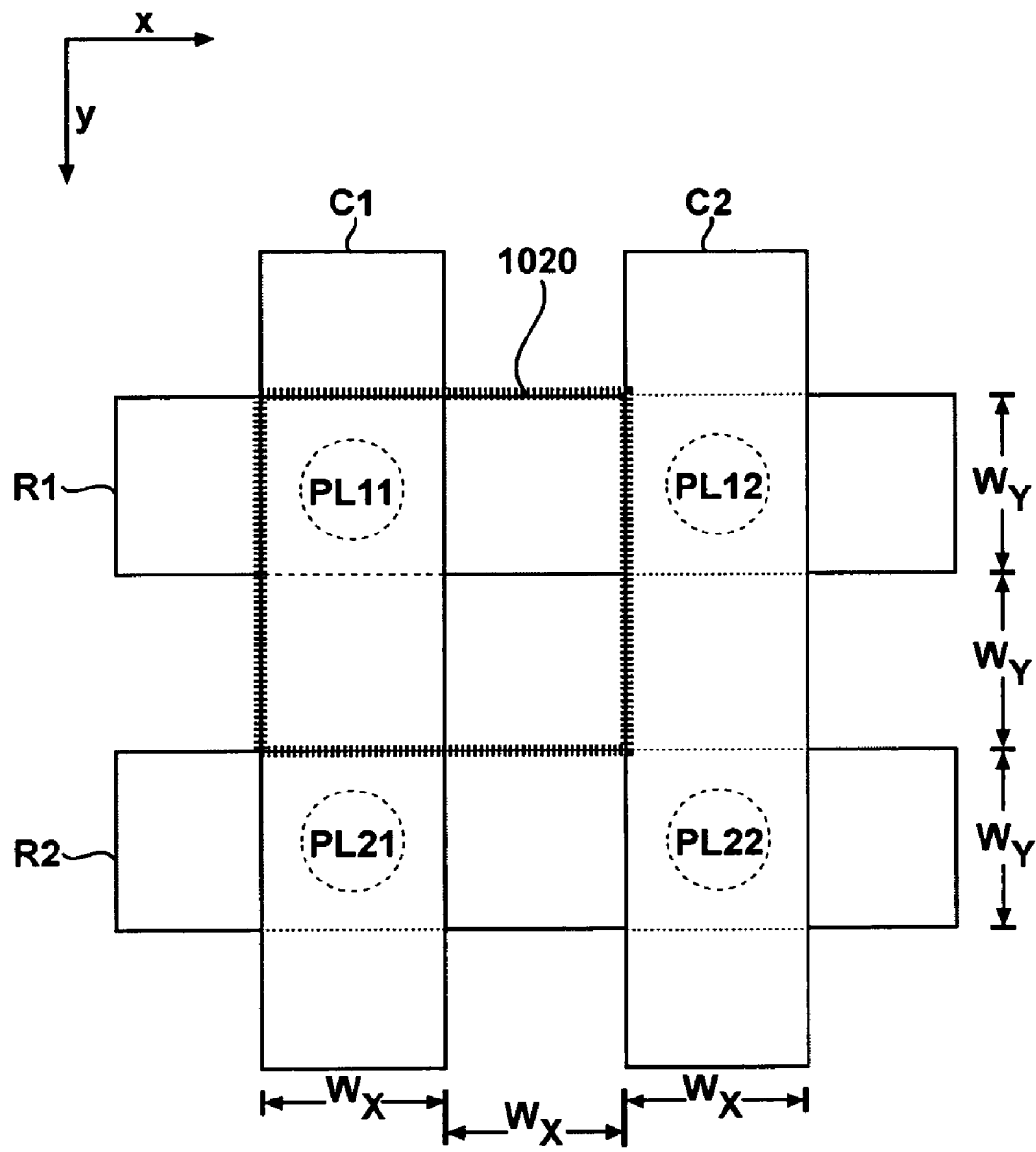
FIG. 25B is a top view of a two-dimensional memory array showing a lateral cross section of a unit volume.

In this case, footprint size is less than $4(W_x)(W_y)$, and cell size is less than $2(W_x)(W_y)$ An example of a two-dimensional array is shown in FIG. 25B. In this example, there are only two row lines R1, R2 and only two column lines C1, C2. Each of the row lines may also have a width $W_y$ in the Y-dimension and each of the column lines may also have a width $W_x$ in the X-dimension. There is also a space of width $W_x$ between each of the column lines and a space of width $W_y$ between each of the row lines. FIG. 25B shows the unit volume 1020 of the two-dimensional array. The unit volume includes a single memory cell and has a lateral dimension in the X-direction of $2W_x$ and a lateral dimension in the Y-direction of $2W_y$. The total footprint area of the unit volume 1020 is $4(W_x)(W_y)$. Since, the unit volume 1020 includes only a single memory cell, the cell size of the array is also $4(W_x)(W_y)$. In an embodiment of the invention, $W_x=W_y=W$ which may be about (5/3)F.

Hence, it is seen that the three-dimensional memory array of the present invention may have memory cell size which is less than the memory cell size of a two-dimensional array. This is an advantage of the three-dimensional memory array.

Another advantage of the three-dimensional memory array is that since the memory cells need not contact the substrate, the substrate is available for use other than for defining the memory cells. In one embodiment of the present invention, the area in the substrate may be used for at least portions of the row decoders, column decoders, I/O multiplexors, and read/write circuits. This helps to minimize the fraction of the die surface area not devoted to memory cells.

In the embodiments of the memory array shown in FIGS. 23A-D, there are two lower row lines RL1, RL2 and two upper row lines RU1, RU2. In other embodiments of the invention, the memory array may include more than two lower row lines and more than two upper row lines. More generally, the memory array of the present invention may include at least one lower row line and at least one upper row line.

Likewise, in the embodiments of the memory array shown in FIGS. 23A-D, there are two lower column lines CL1, CL2 and two upper row lines CU1, CU2. In other embodiments of the invention, the memory array may include more than two lower column lines and more than two upper column lines. More generally, the memory array of the present invention may include at least one lower column line and at least one upper column line.

In an embodiment of the invention, a lower memory cell may be electrically coupled between each of the lower row lines and each of the lower column lines. Likewise, an upper memory cell may be electrically coupled between each of the upper row lines and each of the upper column lines. Each lower memory cell includes a lower phase-change memory element in series with a lower diode. Each upper memory cell includes an upper phase-change memory element in series with an upper diode. It is possible that upper and lower diodes be replaced with other types of isolation elements. In an embodiment, there may be at least one upper memory cell. In an embodiment, there may be a plurality of upper memory cells. In an embodiment, there may be at least one lower memory cell. In an embodiment, there may be a plurality of lower memory cells.

Referring again to FIGS. 3 and 7, it is noted that the conductive lines 110*a*, 110*b* and 210*a*, 210*b* were designated as the row lines for the memory array while the conductive lines 312*a*, 312*b* and 412*a*, 412*b* were all designated as the column lines for the memory array. In an alternate embodiment of the invention, it is possible that the conductive lines 110*a*, 110*b* and 210*a*, 210*b* may be designated as the columns lines for the memory array while the conductive lines 312*a*, 312*b* and 412*a*, 412*b* may be designated as the row lines for the array.

In addition, in the embodiments shown in FIG. 7, the conductive lines 312*a*, 312*b* and 412*a*, 412*b* are perpendicular to the conductive lines 110*a*, 110*b* and 210*a*, 210*b*. However, in other embodiments of the invention, they may not be perpendicular. Instead they may merely cross each other at some angle.

Referring to FIG. 2, in an alternate embodiment of the invention, layer 112 may be formed of a p+ type material, layer 114 may be formed of a p type material and layer 116 may be formed of an n+ type material. Likewise, referring to FIG. 6, layer 212 may be formed of a p+ type material, layer 214 may be formed of a p type material and layer 216 may be formed of an n+ type material.

In one or more other embodiments of the invention, the lower diodes and upper diodes may be formed in other ways. In addition, the lower diodes and upper diodes may be replaced with other types of isolation devices. For example, other types of isolation devices include, without limitation, transistors and threshold switches (such as chalcogenide threshold switches and S-type threshold switches).

Figure 24:
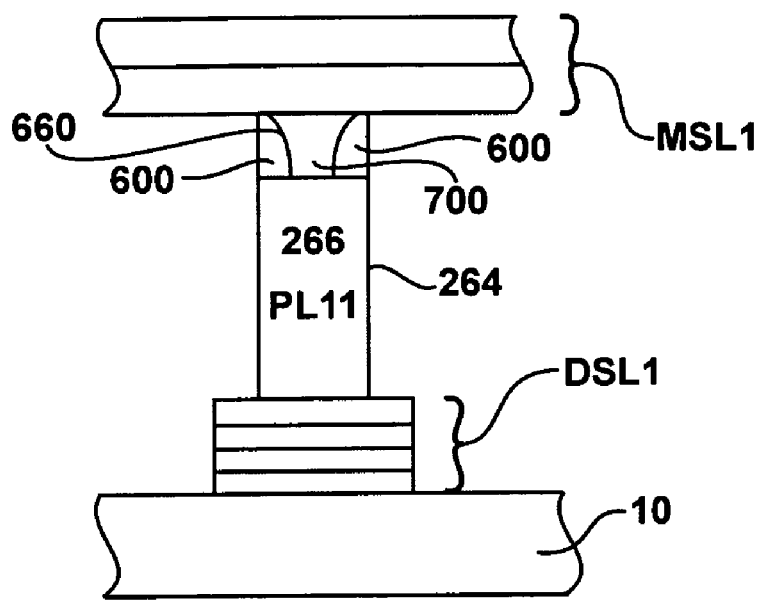
FIG. 24 is a cross-sectional view of a memory cell of the present invention showing an alternate electrode structure.

It is noted that one or more additional conductive layers may placed between the phase-change material and the conductive plugs to form other types and structure for the bottom electrodes of the memory elements. Likewise, one or more additional conductive layers may be placed between the phase-change material and the column lines CL1, CL2, CU1 and CU2 to form other types and structure for the top electrodes of the memory elements. FIG. 24 shows the use of a lower electrode 700 formed by placing a conductive material within a smaller opening 660 defined by dielectric sidewall spacer 600. The material is planarized to form a smaller plug.

The electrode 700 provides for a smaller area of contact with the phase-change material than that provided by the plug PL11.

Examples of the materials which may be used for conductive layers 110, 210, 312, 412 as well as for materials 266 and 366 include, but is not limited to, titanium nitride, titanium aluminum nitride, titanium carbonitride, titanium silicon nitride, molydenum, molybdenum nitride, carbon, carbon nitride, tungsten, tungsten silicide, titanium-tungsten, n-type doped polysilicon, p-type doped polysilicon, n-type doped silicon carbon compounds and/or alloys, p-type doped silicon carbon compounds and/or alloy.

Examples of materials which may be used as the dielectric layers 150, 250, 350 and 500 include oxides and nitrides. Examples of oxides include silicon oxide. Examples of nitrides include silicon nitride.

The memory material may be a phase-change material. The phase-change materials may be any phase-change memory material known in the art. The phase-change materials may be capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase-change materials may be formed from a plurality of atomic elements. Preferably, the memory material includes at least one chalcogen element. Hence, the phase-change material may be a chalcogenide material. The chalcogen element may be chosen from the group consisting of Te, Se, S and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Ge, Sb and Te. An example of a memory material which may be used is $Ge_2Sb_2Te_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt, Co, Ti and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

I claim:

1. A memory array comprising:
   a substrate;
   a first phase-change memory cell disposed over said substrate, said first phase-change memory cell including a first lower contact in series with a first phase-change layer and a first upper contact in series with said first phase-change layer, said first phase-change layer being interposed between said first lower contact and said first upper contact; and
   a second phase-change memory cell disposed over said substrate, said second phase-change memory cell including a second lower contact in series with a second phase-change layer and a second upper contact in series with said second phase-change layer, said second phase-change layer being interposed between said second lower contact and said second upper contact;
   wherein said second lower contact is disposed between said first lower contact and said first upper contact.

2. The memory array of claim 1, wherein said second lower contact is disposed above said first phase-change layer.

3. The memory array of claim 1, wherein said first phase-change layer is disposed above said first lower contact and said second phase-change layer is disposed above said second lower contact.

4. The memory array of claim 1, wherein said first phase-change memory cell further includes a first isolation device in series with said first phase-change layer, said first isolation device being interposed between said first lower contact and said first upper contact and wherein said second phase-change memory cell further includes a second isolation device in series with said second phase-change layer, said second isolation device being interposed between said second lower contact and said second upper contact.

5. The memory array of claim 4, wherein said first isolation device is a diode or transistor.

6. The memory array of claim 4, wherein said first isolation device is a threshold switch.

7. The memory array of claim 4, wherein a first conductive plug interconnects said first isolation device and said first phase-change layer.

8. The memory array of claim 7, wherein a second conductive plug interconnects said second isolation device and said second phase-change layer.

9. The memory array of claim 8, wherein said first conductive plug is electrically isolated from said second conductive plug.

10. The memory array of claim 4, wherein the projection of said second isolation device onto said substrate overlaps the projection of said first isolation device onto said substrate.

11. The memory array of claim 1, wherein said second lower contact is electrically isolated from said first upper contact.

12. The memory array of claim 1, wherein a dielectric material is disposed between said second lower contact and said first upper contact.

13. The memory array of claim 1, wherein said second lower contact is disposed between said first lower contact and said first phase-change layer.

14. The memory array of claim 1, wherein said second upper contact is disposed above said first upper contact.

15. The memory array of claim 1, wherein the projection of said second phase-change layer onto said substrate overlaps the projection of said first phase-change layer onto said substrate.

* * * * *